United States Patent
Tretner et al.

(10) Patent No.: US 10,720,319 B2
(45) Date of Patent: Jul. 21, 2020

(54) METHOD AND A PROCESSING DEVICE FOR PROCESSING AT LEAST ONE CARRIER

(71) Applicant: Infineon Technologies AG, Neubiberg (DE)

(72) Inventors: Jens Tretner, Dresden (DE); Frank Patzig, Altmittweida (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 15/695,045

(22) Filed: Sep. 5, 2017

(65) Prior Publication Data

US 2017/0365460 A1 Dec. 21, 2017

Related U.S. Application Data

(62) Division of application No. 14/494,612, filed on Sep. 24, 2014, now Pat. No. 9,799,505.

(51) Int. Cl.

| H01L 21/02 | (2006.01) |
|---|---|
| H01L 21/67 | (2006.01) |
| B08B 3/00 | (2006.01) |
| B08B 3/02 | (2006.01) |
| B08B 3/04 | (2006.01) |

(52) U.S. Cl.
CPC .... *H01L 21/02041* (2013.01); *H01L 21/6704* (2013.01); *H01L 21/67028* (2013.01); *H01L 21/67057* (2013.01); *H01L 21/67086* (2013.01); *B08B 3/00* (2013.01); *B08B 3/02* (2013.01); *B08B 3/04* (2013.01); *H01L 21/02052* (2013.01)

(58) Field of Classification Search
CPC .................................. H01L 21/67028
See application file for complete search history.

(56) References Cited

U.S. PATENT DOCUMENTS

| 5,286,657 A | 2/1994 | Bran |
| 6,145,519 A | 11/2000 | Konishi et al. |
| 6,315,832 B1 * | 11/2001 | Liu ................ H01L 21/67051 |
| | | 118/602 |

FOREIGN PATENT DOCUMENTS

| CN | 1182281 A | 5/1998 |
| JP | H07283194 A | 10/1995 |
| JP | 3237386 B2 | 12/2001 |

* cited by examiner

*Primary Examiner* — Jason Y Ko
(74) *Attorney, Agent, or Firm* — Viering, Jentschura & Partner mbB

(57) ABSTRACT

A processing device including: a chamber to accommodate at least one carrier in a processing region of the chamber, an inlet structure disposed over the chamber, the inlet structure providing a merging region fluidly connected to the processing region, a first liquid control arrangement coupled at least to the chamber, the first liquid control arrangement configured to provide a first liquid in the processing region of the chamber and to raise a level of the first liquid into the merging region of the inlet structure, and a second liquid control arrangement coupled to the inlet structure, the second liquid control arrangement configured to introduce a second liquid in the merging region, wherein the first liquid control arrangement is further configured to drain the first liquid from the chamber to form a continuous surface layer of the second liquid on the first liquid and to expose the at least one carrier.

10 Claims, 22 Drawing Sheets

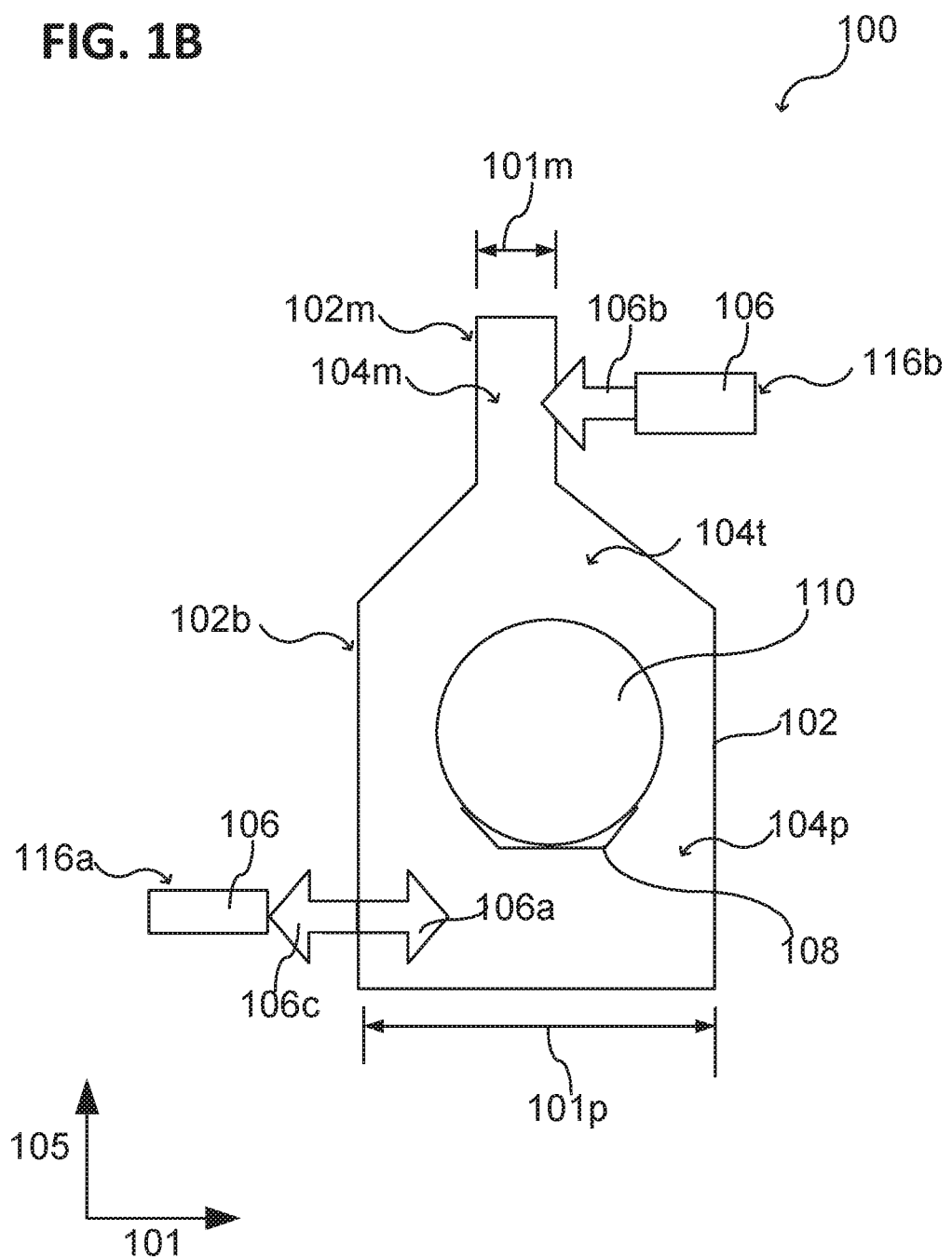

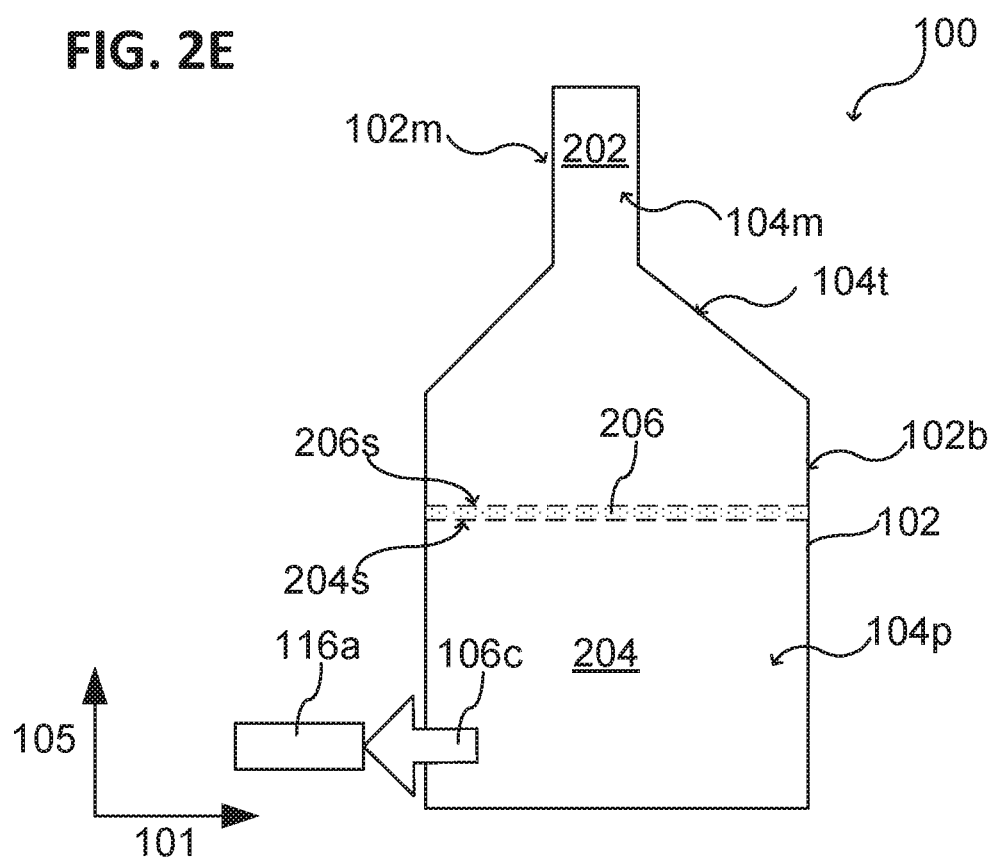

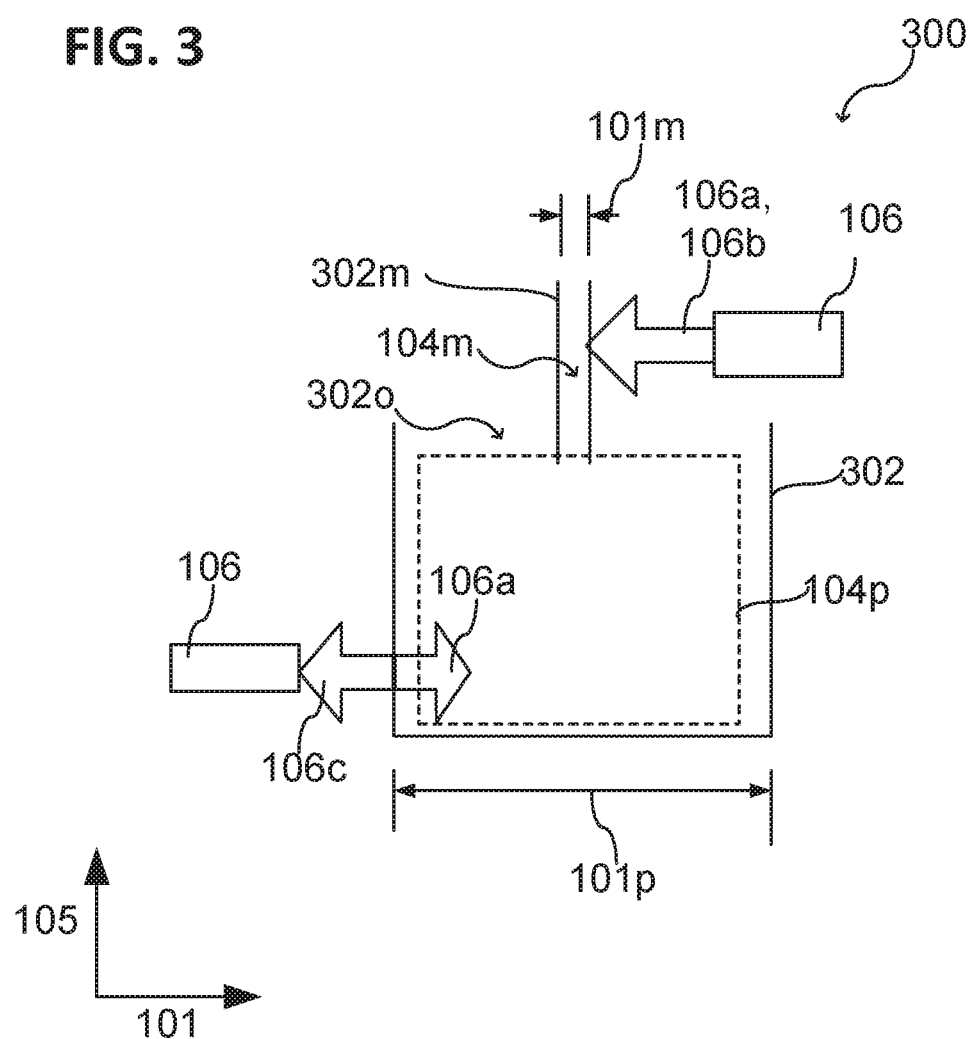

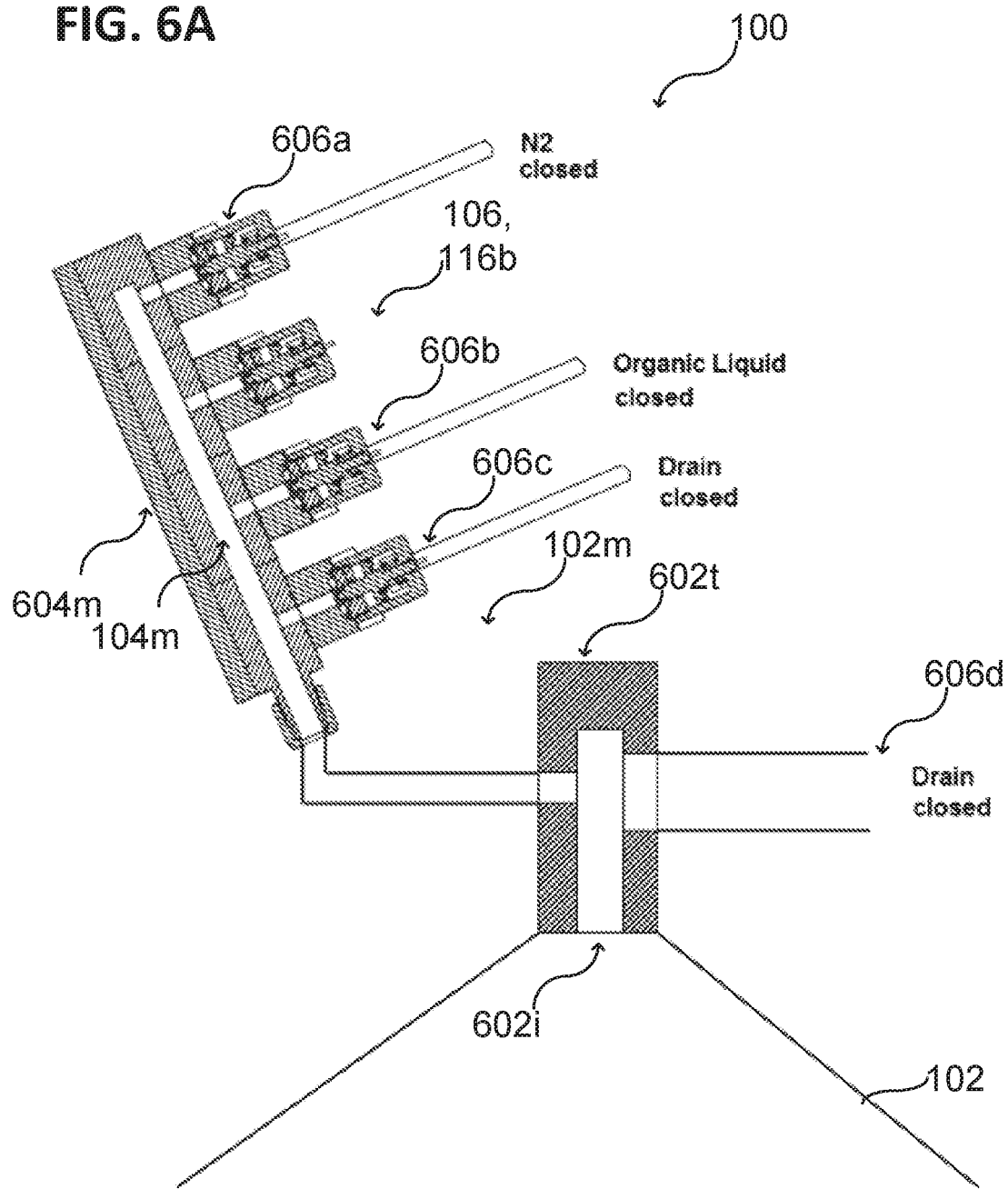

US 10,720,319 B2

METHOD AND A PROCESSING DEVICE FOR PROCESSING AT LEAST ONE CARRIER

RELATED APPLICATION(S)

This application is a divisional of U.S. patent application Ser. No. 14/494,612, filed on Sep. 24, 2014. The content of this application is incorporated herein by reference in its entirety for all purposes.

TECHNICAL FIELD

Various embodiments generally relate to a method and a device for processing at least one carrier.

BACKGROUND

In general, a carrier (e.g. a wafer) being processed in semiconductor technology may be contaminated with particles, dust, or other precipitates adhering at a surface of the carrier (e.g. at a main at a processing surface of the wafer). Therefore, at least one processing tool may be used during the processing and/or after the processing for wet cleaning and subsequently drying the carrier. Conventionally, deionized water may be used to wash the carrier and to remove precipitates from at least one surface of the carrier. In this regard, an alcohol vapor (e.g. isopropyl alcohol—also called isopropanol, propan-2-ol, or IPA) or another organic compound in form of a gas, a vapor, or an aerosol may be utilized for drying the carrier without generating drying residues (e.g. the deionized water may be completely removed from the carrier during a drying process). Conventionally, the carrier may be subjected to alcohol vapor (e.g. the alcohol vapor may be blown over a wet surface of the carrier) or the carrier may be pulled out from the deionized water while an alcohol surface layer may be formed on the water surface from alcohol vapor provided over the water. Using a cleaning liquid, e.g. water (e.g. deionized water), and an alcohol may allow cleaning the carrier and effectively leaving a dry wafer surface taking advantage of the so-called Marangoni effect (Gibbs-Marangoni effect).

SUMMARY

According to various embodiments, a method may include: filling a chamber and a tube coupled to the chamber with a first liquid, the tube extending upwards from the chamber; introducing a portion of a second liquid into the first liquid in the tube; and at least partially removing the first liquid from the chamber to empty the tube into the chamber so that a continuous surface layer from the introduced second liquid is provided on the first liquid in the chamber.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A and 1B respectively show a schematic view of a processing device according to various embodiments;

FIGS. 2A to 2E respectively show a processing device at various steps during operation according to various embodiments;

FIG. 3 shows a schematic view of a processing device according to various embodiments;

FIGS. 6A to 6G respectively show a processing device at various steps during operation according to various embodiments;

DESCRIPTION

Figure 1A:
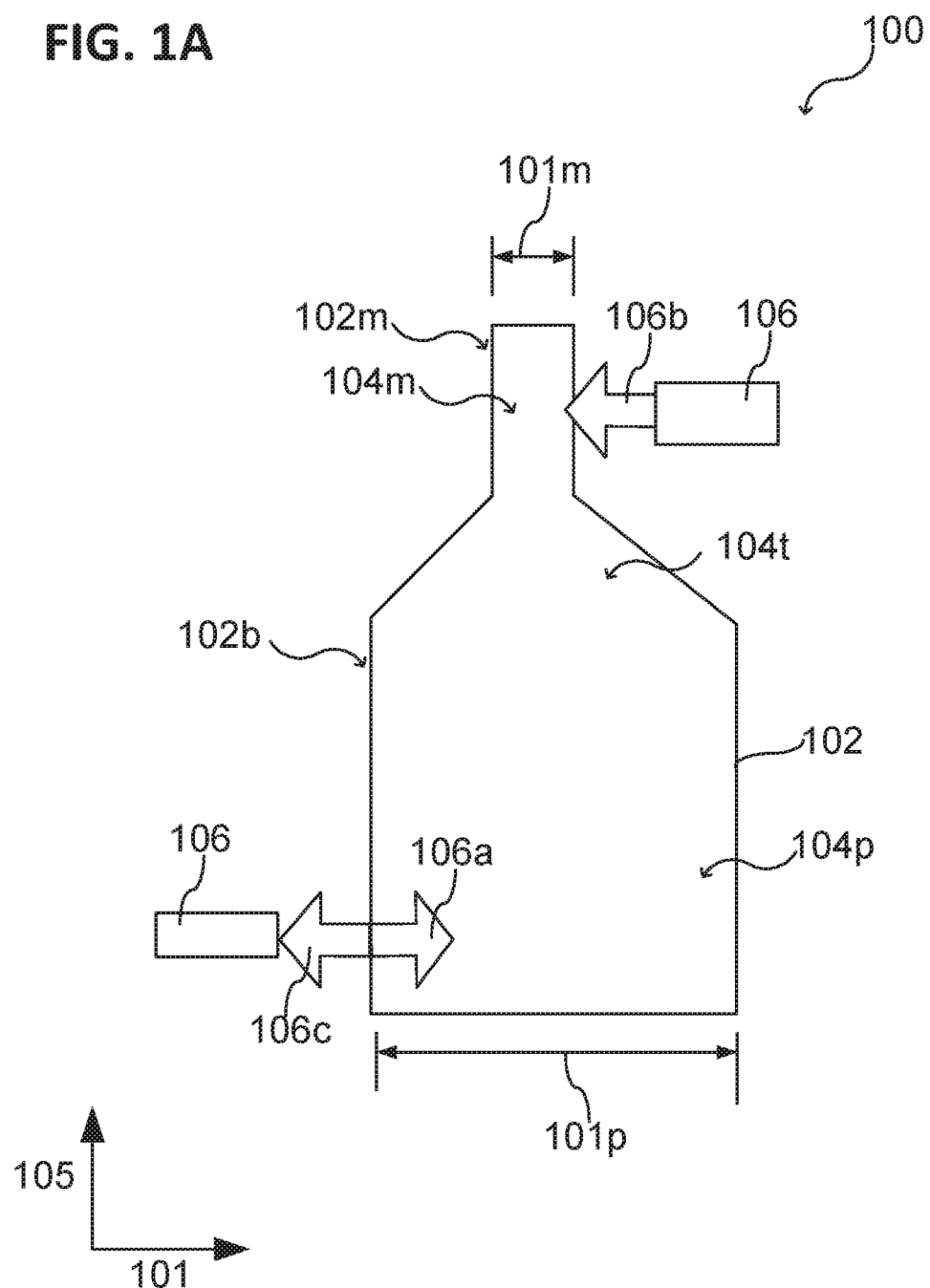

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface may be used herein to mean that the deposited material may be formed "indirectly on" the implied side or surface with one or more additional layers being arranged between the implied side or surface and the deposited material.

In general, various different processes can be applied to clean one or more surfaces of a carrier (e.g. of a wafer, of a glass carrier, of a plate, or of a coating on a carrier). Semiconductor processing may, for example, include lithographic processes and patterning process (e.g. etching, e.g. wet etching) which entail cleaning processes, e.g. rinsing (e.g. with deionized water or aqueous-based agents, e.g. with acids or bases) and/or drying. The drying may be performed to remove the water or the aqueous-based agents from the surfaces of the carrier without leaving watermarks and with a smallest possible surface contamination or for example with a surface contamination less than a predefined surface contamination limit as defined by the respective specifications for a designated technology. Further, a drying process may be for example included in semiconductor processing for the manufacture of integrated circuits (e.g. a chip or a microchip) and/or electronic circuits on a wafer or on another suitable substrate or carrier.

Typical drying processes (e.g. after a wet cleaning process) may include for example the use of an IPA-vapor dryer, an aerosol dryer, or a Marangoni dryer (also called surface tension gradient dryer, STG Dryer, or gradient dryer). Most commonly used drying solutions may have a kind of vaporization of IPA in common, e.g. a thermal evaporation of IPA in a vapor dryer, e.g. an aerosol provided in the Marangoni dryer or in the aerosol dryer, the aerosol being generated by an atomizer, by megasonic oscillator or ultrasonic oscillator, or by a venturi nozzle).

However, an effective drying of a carrier may be obtained by taking advantage of the Marangoni effect. Marangoni drying may include an introduction (commonly obtained by evaporation and/or diffusion of vapor) of a surface tension reducing organic compound (e.g. alcohol such as IPA) in a vicinity of a meniscus of a thin film of water adhering to a substrate, wherein the substrate may be pulled out of the water. Due to the surface tension gradients, the water may flow away from the substrate such that the substrate surface remains free from the water.

Commonly used drying processes (e.g. included in wet chemical systems) which utilize the Marangoni effect may base on the evaporation, vaporization, and/or atomization of IPA for generating a liquid IPA-layer on a water surface. Therefore, the process can be controlled only with great effort, e.g. the control of the amount of IPA to be used may be difficult which may result in a fluctuation of the quality of the drying in such that for example given specifications may not be met. Further, due to an evaporation of the IPA, contaminants (e.g. metal contaminants) may be concentrated in the remaining liquid IPA since each IPA production has a residual of metal contamination. Therefore, commonly applied drying processes may have the requirement to use expensive high-quality IPA (with less residual metal contamination) and/or increased maintenance efforts and costs. Due to the need of evaporating IPA in the commonly used drying processes, the possibility to use a mixed solution of different alcohols may be excluded, since different alcohols may have different evaporation behavior which makes a precise process control impossible. For example, the vaporization of IPA may not allow the use of a mixture of ethanol and/or methanol with the IPA.

According to various embodiments, a processing device and a corresponding method may be provided which may allow drying a wafer (or any other type of carrier) taking advantage of the Marangoni effect without vaporizing the second liquid forming the surface tension reducing surface layer over the first liquid containing the wafer to be dried. According to various embodiments, a wafer may be vertically pulled out of water such that the water surface forms a meniscus at the wafer surface, wherein a surface tension reducing organic compound (e.g. alcohol or IPA) may be provided on the water surface (e.g. a thin film of a surface tension-reducing organic compound) without evaporating the surface tension-reducing organic compound.

Illustratively, the method and the processing device illustrated herein may be used to provide a thin liquid surface layer of a first liquid over a second liquid, wherein the two liquids are soluble in each other. According to various embodiments, a thin liquid surface layer of a surface tension-reducing organic compound, e.g. an alcohol or a mixture including different types of surface tension-reducing organic compounds, e.g. different types of alcohols, may be provided over a host liquid, e.g. over water or a water based liquid.

According to various embodiments, a processing device may be provided herein, wherein the processing device may allow forming an IPA layer (or a layer including another alcohol or a mixture of alcohols) over a water surface without evaporating the IPA. Thereby, a Marangoni-effect-based drying process may be provided which may include a better control of the amount of IPA being used and of the IPA layer formation during the drying process. Further, since the IPA may not be converted into the gas phase for the layer formation, according to various embodiments, side effects such as distillation of metals may be almost zero or may not substantially influence the drying process.

According to various embodiments, an intermixing of IPA and water may be prevented by introducing IPA into water provided in a tube (pipe) and by slowly lowering the water level in the tube (draining the tube into a chamber) such that an accurate formation of an IPA surface layer over the water is enabled.

Since no sputtering, atomization, or evaporation may take place, other alcohols than IPA (e.g. ethanol, methanol, and the like) may be used as a surface layer covering the water. This may allow an improvement in semiconductor processing, e.g. in the manufacture of field effect transistors. The cleaning with other alcohols than IPA may improve, for example, the formation and/or the properties of a gate oxide formed on a wafer during semiconductor processing.

According to various embodiments, the processing device for drying a wafer or a carrier may be included into a wet process system, a wet station, or wet bench system as used in semiconductor processing. A wet process system, a wet station and/or a wet bench system may be used in semiconductor processing or in the manufacture of micro-electromechanical systems (MEMS) and/or light emitting diodes (LEDs). A wet process system, a wet station and/or a wet bench system may be used for example for wafer cleaning (Si wafer or GaAs wafer cleaning), etching (e.g. KOH etching), solar cell carrier cleaning, cleaning of polysilicon chunks, bars and ingots, and for cleaning medical and/or biomedical parts.

According to various embodiments, the method and the device for processing at least one carrier described herein may provide a low metal and particle contamination remaining on the dried wafer or carrier which may prevent or at least reduce for example a formation of poly bumps on a poly-Silicon surface. Further, according to various embodiments, the method and the device for processing at least one carrier described herein may not include a distillation of IPA (e.g. as it would be the case using a vaporizer) which may prevent an enrichment of metal contaminations (e.g. an iron contamination) in the IPA. Further, according to various embodiments, the method and the device for processing at least one carrier described herein may prevent the formation of water marks on the wafer or the carrier to be dried which may be typically caused by a commonly used more instable drying process.

Further, the technical effort for efficiently drying a carrier of a wafer may be reduced, including aspects like power consumption, nitrogen supply, and the necessary technical equipment. Further, as already described, all kind of alcohols and mixtures from alcohols, e.g. from ethanol, methanol and/or IPA, may be utilized for wafer drying.

According to various embodiments, the method and the device for processing at least one carrier described herein may allow a better IPA control and a better (an easy and accurate) control of the border line (interface) between IPA and water.

According to various embodiments, the method and the device for processing at least one carrier described herein may allow a better control of IPA dosing (e.g. in 30 ml steps) and/or a better control of IPA consumption which may result in less water marks and an improved slot drying. The IPA consumption may be reduced for example from more the 500 ml for forming an 8 mm IPA-layer in commonly used Marangoni dryers to less than about 400 ml for a 6 mm IPA-layer without losing drying quality. Further, since the IPA-layer may be formed from a fluid, the formation of drops after the drying may be prevented or at least reduced.

However, other host liquids than water may be used for drying a wafer or a carrier, e.g. acid solutions including for example HF and/or HCL or alkaline solutions including for example NaOH and/or KCl. In this case, the IPA liquid layer may be provided over the host liquid.

FIG. 1A illustrates a processing device 100 for processing at least one carrier in a schematic cross sectional view according to various embodiments. The direction 101 illustrated in the figures may be the horizontal direction and the direction 105 may be the vertical direction.

The processing device 100 may include a chamber 102 for accommodating the at least one carrier in a processing region 104p of the chamber 102. Further, a merging region 104m may be provided over the processing region 104p. According to various embodiments, the merging region 104m may be tapered to a smaller horizontal extension 101m than the horizontal extension 101p of the processing region 104p. Illustratively, the chamber 102 may be configured to provide the merging region 104m over the processing region 104p, wherein the merging region 104m may provide a small volume compared to the processing region 104p.

According to various embodiments, the horizontal extension 101p of the processing region 104p may be defined by the shape of the interior of the chamber 102. According to various embodiments, the chamber 102 or the interior of the chamber 102 may have a cylindrical (or prismatic) shape with a first inner diameter 101p defining the lateral extension of the processing region 104p. According to various embodiments, the horizontal extension 101m of the merging region 104m may be defined by the shape of the interior of the chamber 102. According to various embodiments, the chamber 102 or the interior of the chamber 102 may have a cylindrical (or prismatic) shape with a second inner diameter 101m defining the lateral extension of the merging region 104m. Further, according to various embodiments, the chamber 102 may be configured to provide a transition region 104t between the processing region 104p and the merging region 104m.

According to various embodiments, the chamber 102 may include a body 102b providing the processing region 104p and optionally at least a part of the transition region 104t. Further, the chamber 102 may include a hollow structure 102m (an inlet structure 102m) providing the merging region 104m and optionally at least a part of the transition region 104t.

According to various embodiments, the horizontal extension 101p of the processing region 104p may be defined by the shape of the interior of the body 102b of the chamber 102. According to various embodiments, the body 102b or the interior of the body 102b may have a cylindrical shape with a first inner diameter 101p defining the lateral extension of the processing region 104p.

According to various embodiments, the horizontal extension 101m of the merging region 104m may be defined by the shape of the interior of the hollow structure 102m of the chamber 102. The hollow structure 102m may be, for example, a pipe, a tube or a pipe structure extending for example upwards from the chamber 102 or extending at least partially upwards from the chamber 102. According to various embodiments, the hollow structure 102m may be a manifold or may include a manifold for inserting one or more fluids and/or at least one gas into the chamber 102, e.g. into the processing region 104p. According to various embodiments, hollow structure 102m may have a second inner diameter 101m defining the lateral extension of the processing region 104p.

According to various embodiments, the chamber 102 may be configured to be filled with water or another fluid. Illustratively, the chamber 102 may be watertight or airtight such that the chamber 102 can be filled with water or such that the chamber 102 can be pressurized.

Further, according to various embodiments, the processing device 100 may include a control arrangement 106 coupled to the chamber 102, wherein the control arrangement 106 may be configured to fill 106a the processing region 104p and the merging region 104m with water. Illustratively, the chamber 102 may be filled with water from the bottom such that the water level rises until the processing region 104p and the merging region 104m are filled with water. The processing region 104p may be completely filled with water and the merging region 104m may be at least partially filled with water.

Further, according to various embodiments, the control arrangement 106 may be configured to introduce 106b an organic liquid into the merging region 104m in liquid form. Illustratively, the organic liquid (which may serve as surface tension reducing agent) may be introduced 106b into the water in the merging region 104m. Since the merging region 104m can be provided with a smaller diameter 101m than the processing region 104p, it is possible to provide the organic liquid in the water such that the two fluids being soluble in each other are substantially not mixing each other. It has to be noted that it would be not effective to introduce the organic liquid directly into the water in the processing region 104p to form a thin surface layer of the organic liquid on the water. Rather, the organic liquid and the water would mix each other if the organic liquid would be introduced directly into the processing region 104p. Referring to this, the horizontal extension 101p of the processing region 104p may be for example greater than about 10 cm or greater than about 20 cm, or greater than about 30 cm, depending, for example, on the wafer or carrier which is to be processed, wherein the horizontal extension 101m of the merging region 104m may be, for example, less than about 10 cm or less than about 5 cm, or less than about 3 cm such that a small volume may be provided for introducing the organic liquid into the chamber 102. According to various embodiments, the dimension of the processing device 100 may be adapted to the dimensions of the carrier to be dried.

Further, according to various embodiments, the control arrangement 106 may be configured to lower 106c the level of the water (the water level) from the merging region 104m to the processing region 104p to form a continuous surface layer on the water from the organic liquid which has been introduced into the merging region 104m. Further, according to various embodiments, the control arrangement 106 may be configured to slowly drain 106c the water to form a continuous surface layer on the water from the organic liquid (which has been introduced into the merging region 104m) in the processing region 104p. Illustratively, the organic liquid may laterally extend from a volume (portion) being introduced into the merging region 104m to a thin layer in the processing region 104p with reducing the water level in the chamber 102 from the merging region 104m to the processing region 104p.

According to various embodiments, the control arrangement 106 may be configured to lower 106c the water level (to drain the water) slowly such that no turbulences are generated which would result in a mixing of the water and the organic liquid. According to various embodiments, the water may include a base or an acid. In other words, the water may be also an aqueous solution.

As illustrated in FIG. 1B in a schematic cross sectional view, according to various embodiments, the processing device 100 may include a support structure 108 to hold the at least one carrier 110 (e.g. at least one wafer 110) in the processing region 104p of the chamber 102. The support structure 108 may be configured to support more than one carrier 110 (e.g. more than one wafer 110) which may allow processing (e.g. cleaning and drying) a plurality of carriers 110 at the same time. Illustratively, the support structure 108 may be configured to support a wafer batch such that the wafer batch 110 may be processed in the chamber 102 of the processing device 100.

According to various embodiments, the processing device 100 may be configured such that the carrier 110 may be cleaned in the processing region 104p, e.g. before the drying process is carried out.

According to various embodiments, the control arrangement 106 may include at least a first flow control structure 116a (e.g. a first flow controller 116a) and a second flow control structure 116b (e.g. a second flow controller 116b). The first flow control structure 116a may be configured to raise 106a the water level inside the chamber 102 to the merging region, e.g. by pumping water into the processing region 104p of the chamber 102 or by controlling a valve structure to flood the chamber 102 with water (through the processing region 104p). The second flow control structure 116b may be configured to introduce 106b a portion of the organic liquid directly into the water in the merging region 104m, e.g. by pumping the organic liquid from a reservoir into the merging region 104m of the chamber 102 or by controlling a valve structure to insert the organic liquid into the merging region 104m of the chamber 102. The first flow control structure 116a may be further configured to at least partially drain 106c the water from the chamber to lower the water level, e.g. by pumping water out of the processing region 104p of the chamber 102 or by controlling a valve structure to drain the water from the chamber 102 (through the processing region 104p).

According to various embodiments, the first flow control structure 116a may have two operation modes 106a, 106c which may include firstly flooding 106a the chamber 102 or raising the water level in the chamber 102, and secondly draining 106c the chamber 102 or lowering the water level in the chamber 102.

According to various embodiments, the control arrangement 106 (e.g. using the first flow control structure 116a) may be configured to lower the level of the water in the processing region 104p to expose the at least one carrier 110 accommodated in the processing region 104p of the chamber 102. Further, according to various embodiments, the control arrangement may include a gas flow control structure or a gas flow controller configured to introduce a gas into the chamber while the water level in the chamber 102 is lowered, e.g. to avoid turbulences caused by vacuum (or low pressure) while draining 106c the chamber 102. According to various embodiments, the gas flow controller may be included in the second flow control structure 116b. In other words, the second flow control structure 116b may include a plurality of supply lines and valves for fluids and/or gases.

According to various embodiments, the control arrangement 106 may further include an electronic control system operating, for example, the first flow control structure 116a and the second flow control structure 116b.

As illustrated in FIG. 1A and FIG. 1B, the horizontal extension 101p of the processing region 104p of the chamber 102 may decrease to the horizontal extension 101m of the merging region 104m. This may, for example, contribute to reduce turbulences in the fluids while lowering the water level in the chamber 102. According to various embodiments, lowering the water level or draining the water from the chamber 102 may also cause lowering the organic liquid being introduced into the merging region 104m since the organic liquid may substantially float on the water surface. While the water level is lowered from the merging region 104m to the processing region 104p, the organic liquid being introduced into the merging region 104m of the chamber 102 may completely cover the upper surface of the water, and since the horizontal extension of the upper surface of the water may increase with the increasing horizontal extension of the chamber 102 from the merging region 104m to the processing region 104p, the organic fluid layer may become thinner while lowering the water level.

According to various embodiments, a processing device 100 may include a chamber 102a to accommodate at least one carrier 110 in a processing region 104p of the chamber 102a. The processing device 100 may further include an upwardly extending inlet structure 102m coupled to the chamber 102a, the inlet structure 102m providing a merging region 104m connected to the processing region 104p (e.g. by the transition region 104t). The processing device 100 may further include a first liquid control arrangement 116a (a first liquid control structure) coupled at least to the chamber 102b and optionally to the inlet structure 102m, wherein the first liquid control arrangement 116a may be configured to provide a first liquid (e.g. water) in the processing region 104p of the chamber 102b and to raise 106a a level of the first liquid into the inlet structure 102m. The processing device 100 may further include a second liquid control arrangement 116b (a second liquid control structure) coupled to the inlet structure 102m, wherein the second liquid control arrangement 116b may be configured to introduce 106b a second liquid (e.g. a surface tension reducing agent to reduce the surface tension of the first liquid) into the merging region 104m in liquid form. Further, the first liquid control arrangement 116a may be configured to drain 106c the first liquid from the chamber 102b to form a continuous surface layer on the first liquid from the second liquid introduced into the merging region 104m and to expose the at least one carrier 110. According to various embodiments, the processing device 100 may further include a gas control arrangement coupled to the inlet structure 102m, wherein the gas control arrangement may be configured to introduce gas (e.g. clean air or nitrogen) into the inlet structure 102m while the level of the first liquid is reduced to compensate, for example, an amount of the first liquid drained from the chamber 102b.

According to various embodiments, the term level, level of a liquid, or water level may be used herein to mean a fill level, a fill height or a liquid level.

In the following, the FIGS. 2A to 2E respectively illustrate a processing device 100, as described herein, at various stages during operation, e.g. during a method for processing (drying) a carrier 110 is carried out (cf. FIG. 5).

Figure 2A:
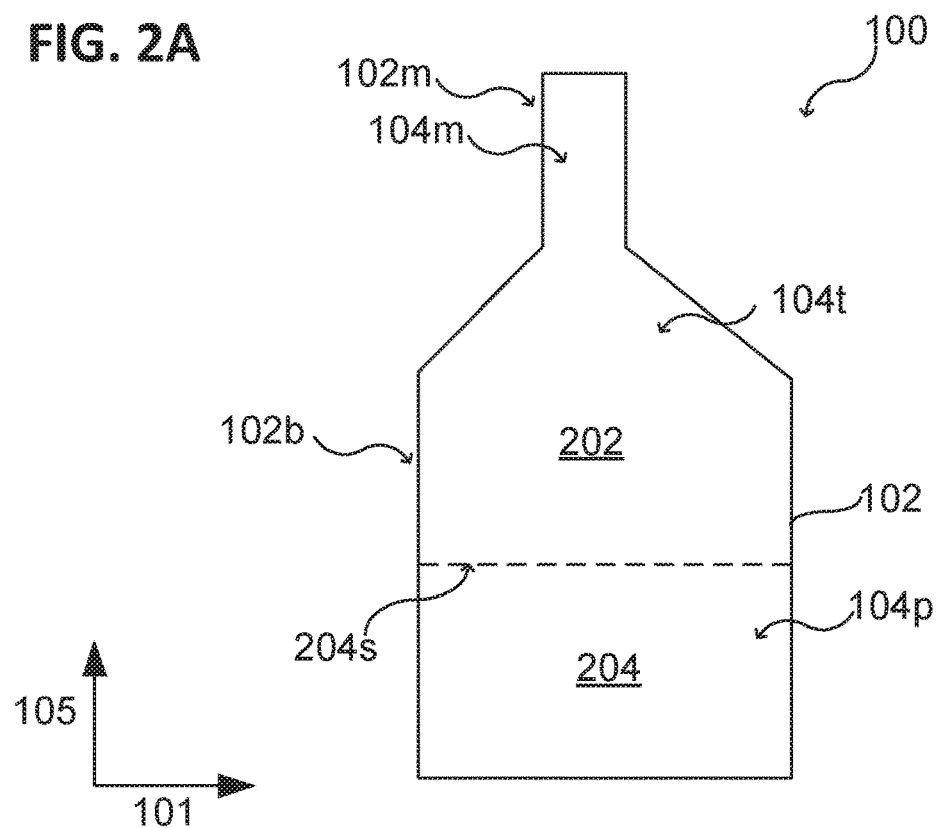

FIG. 2A illustrates the processing device 100 in a schematic cross sectional view, according to various embodiments, wherein the chamber 102b may be partially filled with a first liquid 204 (e.g. water 204 or an aqueous based solution). The first liquid level (the water level) may be regarded as height position (related to the vertical direction 105) of the exposed surface 204s of the first liquid 204, e.g. defined by the amount of the first liquid 204 located in the chamber 102b. As illustrated in FIG. 2A, the first liquid level 204s may be situated in the processing region 104p. The remaining space in the chamber 102b and in the inlet structure 102m (over the first liquid 204) may be filled for example with nitrogen 202 (or another gas).

Figure 2B:
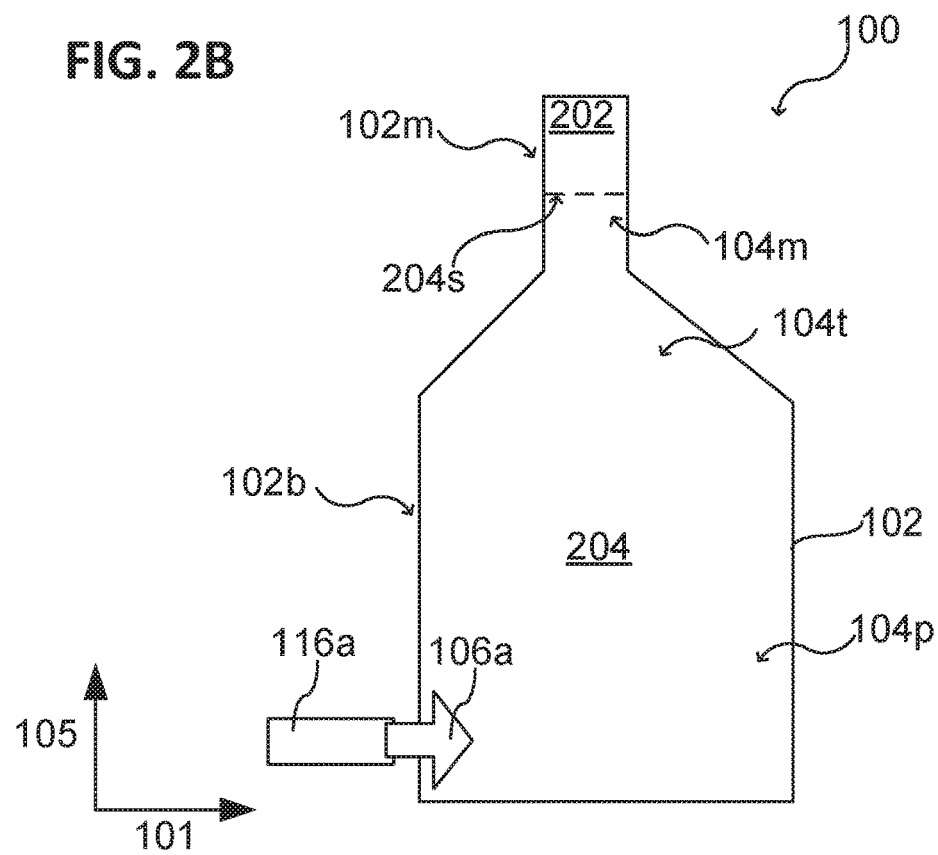

According to various embodiments, the chamber 102b and an inlet structure 102m (e.g. a tube 102m) coupled to the chamber 102b may be filled with the first liquid 204, wherein the inlet structure 102m may extend upwards from the chamber 102b, as illustrated in a schematic cross sectional view of the processing device 100 in FIG. 2B. Therefore, the first liquid 204 may be introduced 106a into the chamber 102b by the first flow control structure 116a coupled to the chamber 102b. The first liquid level may rise up to the merging region 104m in the inlet structure 102m.

Figure 2C:
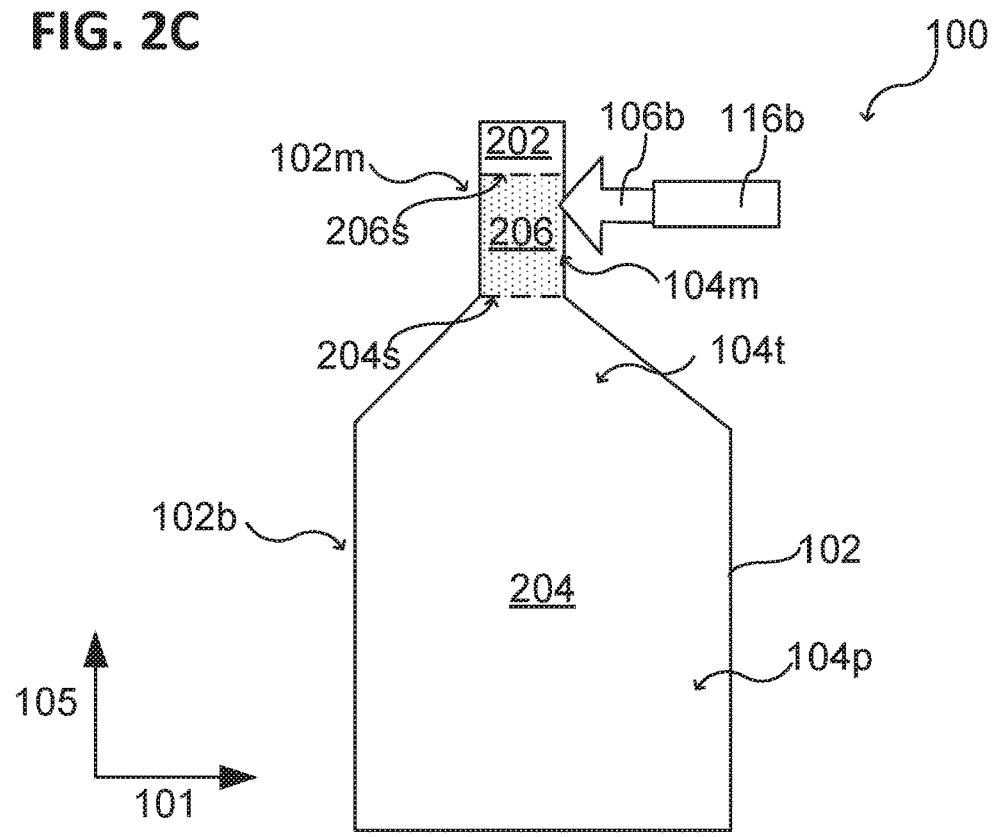

FIG. 2C illustrates the processing device 100 in a schematic cross sectional view, according to various embodiments, wherein a portion of the second liquid 206 (e.g. an organic liquid) has been introduced 106b into the first liquid 204 in the inlet structure 102m and/or over the first liquid 204 in the inlet structure 102m. According to various embodiments, a predefined amount of the second liquid 206 may be introduced 106b into the merging region 104m of the inlet structure 102m, e.g. over the first liquid 204. According to various embodiments, the second liquid 206 may be a surface tension reducing liquid for the first liquid 204.

According to various embodiments, the second liquid 206 may be introduced 106b into the merging region 104m of the inlet structure 102m by the second flow control structure 116b coupled to the inlet structure 102m. As illustrated in FIG. 2C, the second liquid 206 may form a second surface layer 206s over the first surface layer 204s, wherein the second liquid 206 may illustratively float on the first liquid 204. According to various embodiments, the inlet structure 102m may be partially filled with the second liquid 206 or completely filled with the second liquid 206.

Figure 2D:
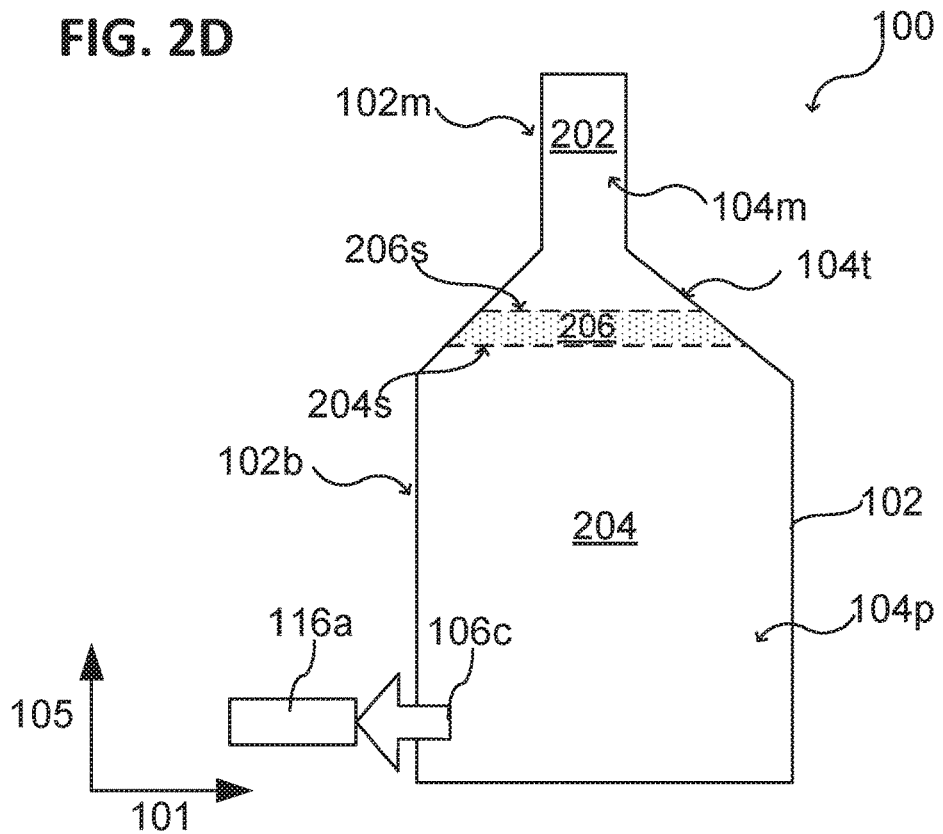

FIG. 2D illustrates the processing device 100 in a schematic cross sectional view, according to various embodiments, wherein the first liquid 204 has been partially drained 106c from the chamber 102b such that the inlet structure 102m is also drained (emptied) into the chamber 102b, wherein a continuous surface layer 206 from the introduced second liquid 206 is formed on the first liquid 204 in the chamber 102b.

FIG. 2E illustrates the processing device 100 in a schematic cross sectional view, according to various embodiments, wherein the first liquid 204 has been further drained 106c from the chamber 102b such that the continuous surface layer 206 from the introduced second liquid 206 is lowered into the processing region 104p of the chamber 102b.

According to various embodiments, the portion 206 of the second liquid 206 may be introduced into the first liquid 204 in the inlet structure 102m (tube 102m) such that the introduced second liquid 206 may be substantially separated from the first liquid 204 in the small volume of the inlet structure 102m. Further, according to various embodiments, the portion 206 of the second liquid 206 may be introduced into the first liquid 204 in the inlet structure 102m (tube 102m) such that the introduced second liquid 206 may substantially cover the surface 204s of the first liquid 204 in the inlet structure 102m.

According to various embodiments, while at least partially removing the first liquid 204 from the chamber 102b, as for example illustrated in FIG. 2D and FIG. 2E, nitrogen may be introduced into the inlet structure 102m to avoid a vacuum (e.g. a pressure below atmospheric pressure) in the inlet structure 102m or in the chamber 102b.

According to various embodiments, the first liquid 204 may be removed or drained continuously to continuously lower the level of the first liquid 204 and the second liquid 206 in the inlet structure 102m and subsequently to continuously lower the level of the first liquid 204 and the second liquid 206 in the chamber 102b.

As described with reference to FIG. 1B, at least one wafer 110 may be provided in the processing region 104p of the chamber 102b before the chamber 102b and the inlet structure 102m are filled with the first liquid 204 as described with reference to FIG. 2A. According to various embodiments, while draining the first liquid 204 from the chamber 102b, as described with reference to FIG. 2D and FIG. 2E, the level of the first liquid 204 and the second liquid 206 may be lowered such that the at least one wafer 110 arranged in the processing region 104p of the chamber 102b may be exposed. According to various embodiments, due to the Marangoni effect, the exposed wafer may be dry and clean.

According to various embodiments, the second liquid 206 may be an organic liquid including an alcohol (with a hydroxyl functional group (—OH) bound to a carbon atom). According to various embodiments, the second liquid may be an organic liquid, e.g. including for example at least one of the following liquids: methanol (methyl alcohol); ethanol (ethyl alcohol); propanol (propan-1-ol); isopropanol (propan-2-ol); butanol (butyl alcohol); cyclohexanol.

Various modifications and/or configurations of the processing device 100 and details referring to the chamber 102, the inlet structure 102m, and the control arrangement 106 are described in the following, wherein the features and/or functionalities described with reference to FIG. 1A, FIG. 1B and FIGS. 2A to 2E may be included analogously. Further, the features and/or functionalities described in the following may be included in the processing device 100 or may be combined with the processing device 100 as described before with reference to FIG. 1A, FIG. 1B and FIGS. 2A to 2E.

FIG. 3 illustrates a processing device 300 for processing (e.g. drying) at least one carrier in a schematic cross sectional view according to various embodiments. The processing device 300 may include a chamber 302 (an open container 302 or an open tank 302) for accommodating the at least one carrier in a processing region 104p of the chamber 302. Further, a merging region 104m may be provided over the processing region 104p, wherein the merging region 104m may be provided by an inlet structure 302m (e.g. by a tube 302m or a tubular structure 302m). The tube 302m or the tubular structure 302m (the inlet structure 302m) may be arranged over the chamber 302. According to various embodiments, at least a part of the inlet structure 302m may extend into the chamber 302, e.g. through an opening 302o in the chamber 302. According to various embodiments, the inlet structure 302m may provide the merging region 104m with a smaller horizontal extension 101m than the horizontal extension 101p of the processing region 104p provided by the chamber 302.

According to various embodiments, the horizontal extension 101p of the processing region 104p may be defined by the shape of the interior of the chamber 302, wherein the processing region 104p of the chamber 302 may be, for example, accessible through the opening 302o at the top of the chamber 302. According to various embodiments, the chamber 302 may have a cylindrical (or prismatic) shape with an inner diameter 101p defining the lateral extension of the processing region 104p. According to various embodiments, the horizontal extension 101m of the merging region 104m may be defined by the inlet structure 302m. According to various embodiments, the inlet structure 302m may have a cylindrical (or prismatic) shape with an inner diameter 101m defining the lateral extension of the processing region 104p. According to various embodiments, the inner diameter 101p of the chamber 302 may be in the range from about several centimeters to about several tens of centimeters, e.g. of about several inches, e.g. in the range from about 15 cm to about 60 cm. According to various embodiments, the inner diameter 101m of the inlet structure 302m may be in the range of about several centimeters, e.g. in the range from about 1 cm to about 10 cm.

According to various embodiments, the inner diameter 101m of the inlet structure 302m may be less than the inner diameter 101p of the chamber 302, e.g. the ratio of the inner diameter 101p of the chamber 302 to the inner diameter 101m of the inlet structure 302m may be greater than 2, greater than 4, or greater than 5. According to various embodiments, the ratio of the inner diameter 101p of the chamber 302 to the inner diameter 101m of the inlet structure 302m may be in the range from about 2 to about 50, e.g. in the range from about 3 to about 40.

According to various embodiments, the inlet structure 302m may be a manifold or may include a manifold for inserting one or more fluids and/or at least one gas into the chamber 302. According to various embodiments, the inlet structure 302m may include a riser such that the fluids of the plurality of gases being for example inserted by the manifold may be introduced into the processing region 104p of the chamber 302. According to various embodiments, the chamber 302 may be watertight such that the chamber 302 can be filled with water or another liquid.

Further, according to various embodiments, the processing device 300 may include a control arrangement 106, wherein the control arrangement 106 may be configured to fill 106a the processing region 104p and the merging region 104m with a first liquid, e.g. with water. Illustratively, the chamber 302 may be filled 106a with the first liquid such that the level of the first liquid in the processing region 104p raises until the processing region 104p is filled with water.

The processing region 104p may be for example completely filled with water and the inlet structure 302m may be arranged to be in contact with the first liquid in the processing region 104p such that the first liquid can be sucked into the inlet structure 302m. In this case, the inlet structure 302m may be coupled to a pump or to a pump system (e.g. to an aspirator) to generate a reduced pressure (e.g. below atmospheric pressure, e.g. a vacuum) in the inlet structure 302m to suck in water from the processing region 104p into the merging region 104m in the inlet structure 302m. Alternatively, the chamber 302 and the inlet structure 302m may be filled with water, wherein the inlet structure 302m and the chamber 102 may be configured such that a hydrostatic head (e.g. a column of the first liquid or a head of the first liquid) can be generated in the inlet structure 302m.

Further, according to various embodiments, the control arrangement 106 may be configured to introduce 106b the second liquid (e.g. the organic liquid) into the merging region 104m in liquid form. Illustratively, the second liquid (which may serve as a surface tension reducing agent for the first liquid) may be introduced 106b into the first liquid in the merging region 104m of the inlet structure 302m. Since the merging region 104m can be provided with a smaller diameter 101m than the processing region 104p, the merging region 104m may be designed such that the two liquids being soluble in each other are not mixing each other when the second liquid is introduced into the merging region 104m. According to various embodiments, the horizontal extension 101p of the processing region 104p may be for example greater than about 10 cm or greater than about 20 cm, or greater than about 30 cm, depending, for example, on the wafer or the carrier which is to be processed, wherein the horizontal extension 101m of the merging region 104m may be, for example, less than about 10 cm or less than about 5 cm, or less than about 3 cm such that a small volume may be provided for introducing the organic liquid into the chamber 102.

Further, according to various embodiments, the control arrangement 106 may be configured to lower 106c the level of the first liquid (e.g. the water level) from the merging region 104m to the processing region 104p to form a continuous surface layer on the first liquid from the second liquid which has been introduced into the merging region 104m of the inlet structure 302m. Illustratively, the hydrostatic head carrying the volume of the second liquid in the merging region 104m of the inlet structure 302m may be drained into the processing region 104p of the chamber 302.

Further, according to various embodiments, the control arrangement 106 may be configured to slowly drain 106c the first liquid from the chamber 302 to form a continuous surface layer on the first liquid in the processing region 104p from the second liquid (which has been introduced into the merging region 104m). Illustratively, the second liquid may laterally extend from a volume being introduced into the merging region 104m to a thin layer in the processing region 104p with reducing the level of the first liquid in the chamber 302.

According to various embodiments, the control arrangement 106 may be configured to lower 106c the level of the first liquid (to drain the first liquid) slowly such that no turbulences are generated which would result in a mixing of the first liquid and the second liquid. According to various embodiments, the first liquid may include water, a base or an acid. In other words, the first liquid may be water or an aqueous solution, wherein the second liquid may be provided to reduce the surface tension of the water or the aqueous solution.

According to various embodiments, the processing device 300 illustrated in FIG. 3 may include a support structure to hold the at least one carrier (or wafer) in the processing region 104p of the chamber 302, in analogy to the processing device 100 described with reference to FIG. 1B. According to various embodiments, the processing device 300 may be configured such that at least one carrier 110 or at least one wafer 110 may be subjected to a cleaning solution (e.g. to water or to an aqueous solution) in the processing region 104p, e.g. before the drying process is carried out.

According to various embodiments, the control arrangement 106 coupled to the chamber 302 and the inlet structure 302m may include at least a first flow control structure and a second flow control structure, as already described. The first flow control structure may be for example coupled to the chamber 302 being configured to raise 106a the level of the first liquid inside the chamber 302, e.g. by pumping the first liquid into the processing region 104p of the chamber 302 or by controlling a valve structure to flood the chamber 302 with the first liquid. According to various embodiments, the second flow control structure may be for example coupled to the inlet structure 302m which is configured to bring the first liquid from the processing region 104p into the inlet structure 302m or to introduce more of the first liquid into the inlet structure 302m such that a fluid column (similar to a hydrostatic head or water column) is provided in the inlet structure 302m. Further, the second flow control structure may be for example configured to introduce a portion of the second liquid directly into the first liquid in the merging region 104m, e.g. by pumping the second liquid from a reservoir into the merging region 104m of the inlet structure 302m or by controlling a valve structure to insert the second liquid into the merging region 104m of the inlet structure 302m. Illustratively, the second liquid may be introduced into the fluid column of the first liquid provided in the merging region 104m of the inlet structure 302m.

The first flow control structure and the second flow control structure may be further configured to at least partially drain 106c the first liquid from the processing region 104p of the chamber 302, e.g. by pumping the first fluid out of the processing region 104p of the chamber 302 or by controlling a valve structure to drain the first fluid from the chamber 302 (through the processing region 104p).

According to various embodiments, the first flow control structure may have two operation modes 106a, 106c which may include firstly flooding 106a the chamber 302 and secondly draining 106c the chamber 302.

According to various embodiments, the control arrangement 106 may be configured to lower the level of the first liquid being covered by a thin layer of the second liquid in the processing region 104p to expose the at least one carrier accommodated in the processing region 104p of the chamber 302. Further, according to various embodiments, the control arrangement may include a gas flow controller configured to introduce gas into the inlet structure 302m while the first liquid is drained from the chamber 302, e.g. to avoid turbulences caused by vacuum (or low pressure). According to various embodiments, the gas flow controller may be included in the second flow control structure. In other words, the second flow control structure may include for example a manifold with a plurality of supply lines and valves for fluids and/or gases.

As illustrated in FIG. 3, the inlet structure 302m may extend to or into the processing region 104p of the chamber 302. This may allow for example forming a thin layer of the second liquid over the first liquid by emptying the inlet structure 302m into the processing region 104p after the second liquid has been introduced into the merging region 104m of the inlet structure 302.

According to various embodiments, a processing device 300 may include a chamber 302 to accommodate at least one carrier 110 in a processing region 104p of the chamber 302. The processing device 300 may further include an upwardly extending inlet structure 302m coupled to the chamber 302, the inlet structure 302m providing a merging region 104m connected to the processing region 104p (e.g. by inlet structure 302m). The processing device 300 may further include a first liquid control arrangement coupled at least to the chamber 302 and optionally to the inlet structure 302m, wherein the first liquid control arrangement may be configured to provide a first liquid (e.g. water) in the processing region 104p of the chamber 302 and to raise 106a a level of the first liquid. The processing device 300 may further include a second liquid control arrangement coupled to the inlet structure 302m, wherein the second liquid control arrangement may be configured to introduce 106b a second liquid (e.g. a surface tension reducing agent to reduce the surface tension of the first liquid) into the merging region 104m in liquid form. Further, the first liquid control arrangement may be configured to drain 106c the first liquid from the chamber 302 to form a continuous surface layer on the first liquid from the second liquid introduced into the merging region 104m and to expose the at least one carrier 110. According to various embodiments, the processing device 300 may further include a gas control arrangement coupled to the inlet structure 302m, wherein the gas control arrangement may be configured to introduce gas (e.g. clean air or nitrogen) into the inlet structure 302m while the level of the first liquid is reduced to compensate for example an amount of liquid drained from the inlet structure 302m.

In the following, the FIGS. 4A to 4D respectively illustrate a processing device 300, as described herein, at various stages during operation, e.g. during a method for processing (drying) a carrier 110 is carried out (cf. FIG. 5).

Figure 4A:
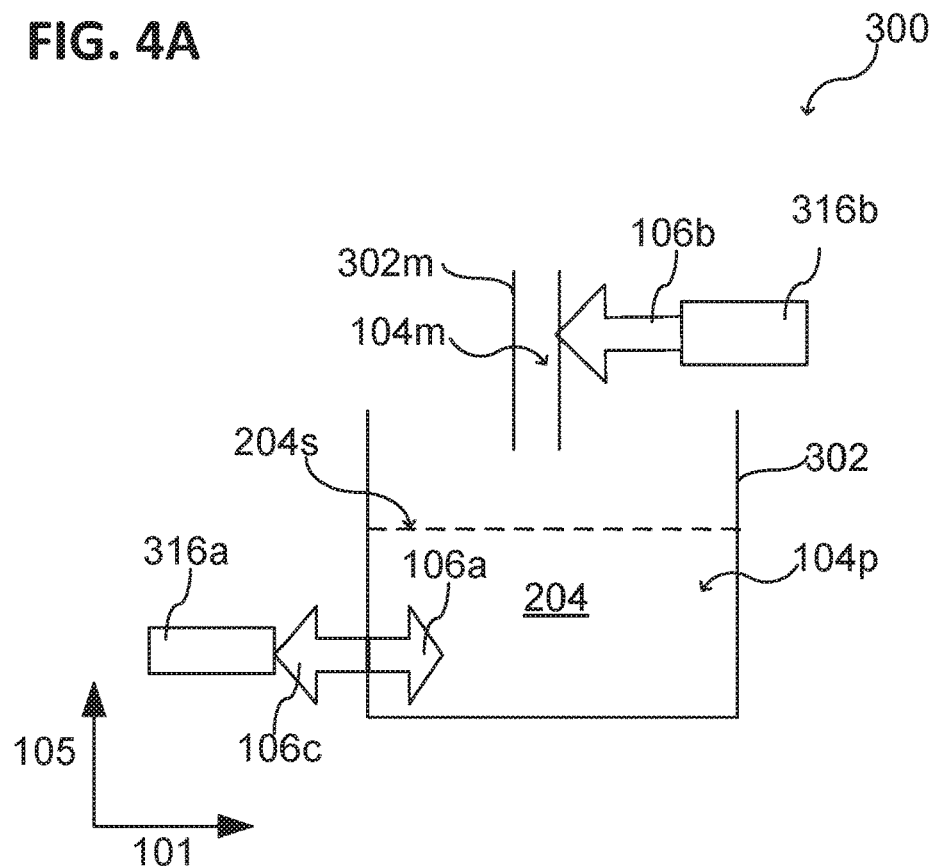
FIGS. 4A to 4D respectively show a processing device at various steps during operation according to various embodiments.

FIG. 4A illustrates the processing device 300 in a schematic cross sectional view, according to various embodiments, wherein the chamber 302 may be partially filled with a first liquid 204 (e.g. water 204 or an aqueous based solution). The first liquid level (the water level) may be regarded as height position (related to the vertical direction 105) of the exposed surface 204s of the first liquid 204, e.g. defined by the amount of the first liquid 204 located in the chamber 302.

Figure 4B:
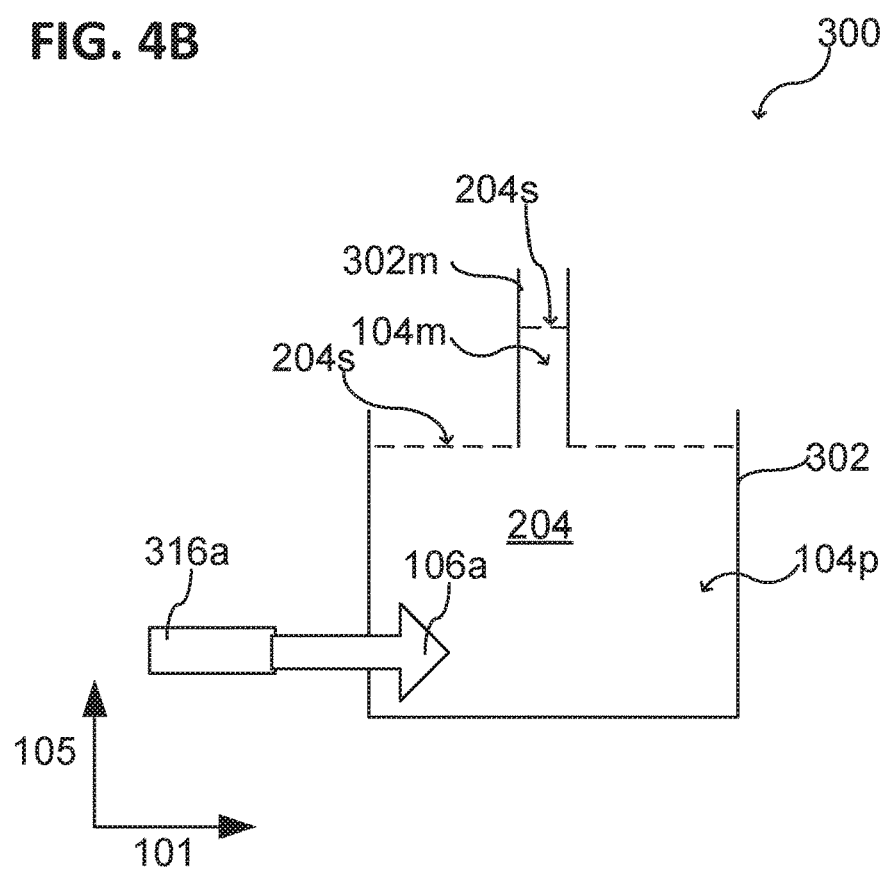

According to various embodiments, the chamber 302 and the inlet structure 302m (the tube 302m) extending into the chamber 302 may be filled with the first liquid 204, wherein the inlet structure 302m may extend upwards from the chamber 302, as illustrated in a schematic cross sectional view of the processing device 300 in FIG. 4B. According to various embodiments, the first liquid 204 may be introduced 106a into the chamber 302 by the first flow control structure 316a or the first liquid control arrangement 316a coupled to the chamber 302. The level of the first liquid 204 may rise up to the inlet structure 102m.

According to various embodiments, the first liquid 204 may be sucked in the inlet structure 302m from the processing region 104p while the first liquid 204 may be provided by the first flow control structure 316a. In this case, the inlet structure 302m may be coupled to a pump such that a vacuum may be provided in the inlet structure 302m to suck in the first liquid 204. Illustratively, the inlet structure 302m and the control arrangement 106 (e.g. the first flow control structure 316a) may be configured to provide a fluid column (or liquid column) of the first liquid 204 in the merging region 104m of the inlet structure 302m. As illustrated in FIG. 4B, the level of the first liquid 204 may be provided in the merging region 104m of the inlet structure 302m.

Figure 4C:
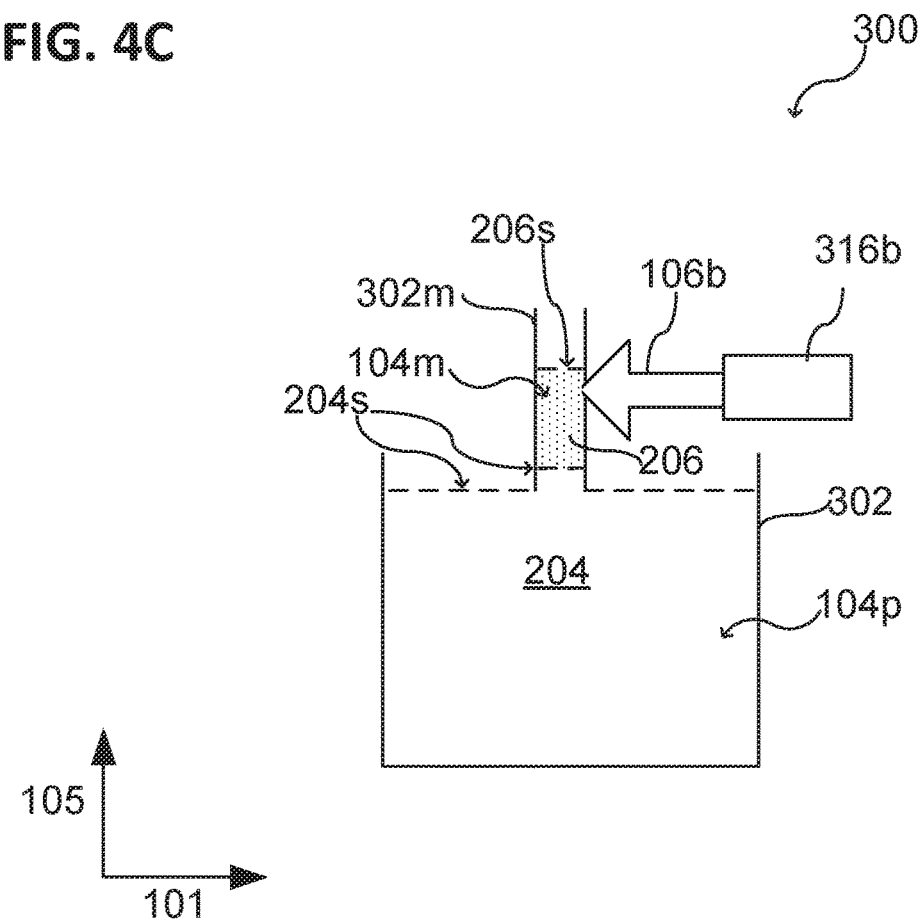

FIG. 4C illustrates the processing device 300 in a schematic cross sectional view, according to various embodiments, wherein a portion of the second liquid 206 (e.g. an organic liquid) has been introduced 106b into the first liquid 204 in the inlet structure 302m and/or over the first liquid 204 in the inlet structure 302m. According to various embodiments, a predefined amount of the second liquid 206 may be introduced 106b into the merging region 104m of the inlet structure 302m, e.g. over the first liquid 204. According to various embodiments, the second liquid 206 may be a surface tension reducing agent for the first liquid 204.

According to various embodiments, the second liquid 206 may be introduced 106b into the merging region 104m of the inlet structure 302m by the second flow control structure 316b or the second liquid control arrangement 316b coupled to the inlet structure 302m. As illustrated in FIG. 4C, the second liquid 206 may form a volume with a second surface layer 206s over the first surface layer 204s, wherein the second liquid 206 may float on the first liquid 204. According to various embodiments, the inlet structure 302m may be partially filled with the second liquid 206 or may be completely filled with the second liquid 206.

Figure 4D:
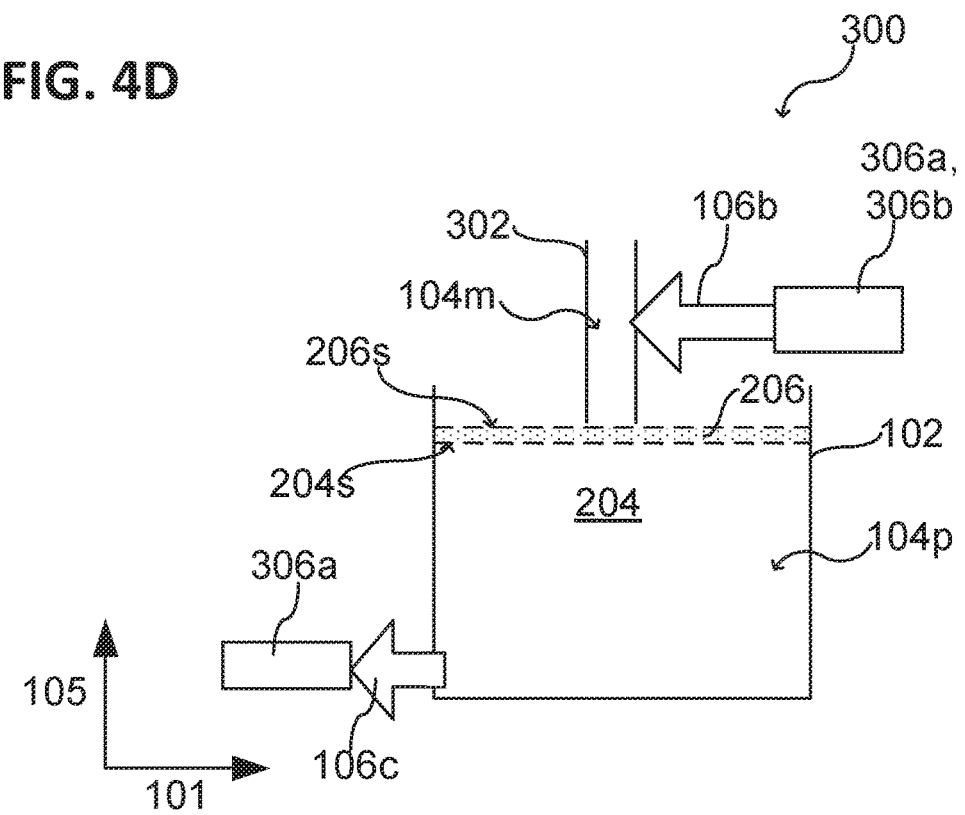

FIG. 4D illustrates the processing device 300 in a schematic cross sectional view, according to various embodiments, wherein the inlet structure 302m is drained (emptied)

into the chamber 302, wherein a continuous surface layer 206 from the introduced second liquid 206 is formed on the first liquid 204 in the chamber 302.

According to various embodiments, the portion 206 of the second liquid 206 may be introduced into the first liquid 204 in the inlet structure 302m (in the tube 102m) such that the introduced second liquid 206 may be substantially separated from the first liquid 204. Further, according to various embodiments, the portion 206 of the second liquid 206 may be introduced into the first liquid 204 in the inlet structure 302m (the tube 102m) such that the introduced second liquid 206 may substantially cover the surface 204s of the first liquid 204 in the inlet structure 302m.

According to various embodiments, while at least partially removing the first liquid 204 from the chamber 102b, as for example illustrated in FIG. 4D, nitrogen may be introduced 106 into the inlet structure 302m to avoid a vacuum in the inlet structure 102m.

According to various embodiments, the first liquid 204 may be removed or drained continuously from the inlet structure 302m and subsequently the first liquid 204 may be removed or drained continuously from the chamber 302 to continuously lower the level of the first liquid 204 and the second liquid 206 in the chamber 302.

As already described, at least one wafer 110 may be provided in the processing region 104p of the chamber 302 before the chamber 302 and the inlet structure 302m are filled with the first liquid 204 as described with reference to FIG. 4A and FIG. 4B. According to various embodiments, while draining the first liquid 204 from the chamber 302, as described herein, the level of the first liquid 204 and the second liquid 206 may be lowered such that the at least one wafer 110 arranged in the processing region 104p of the chamber 302 may be exposed. According to various embodiments, due to the Marangoni effect, the exposed wafer 110 may be dry and clean.

Figure 5:
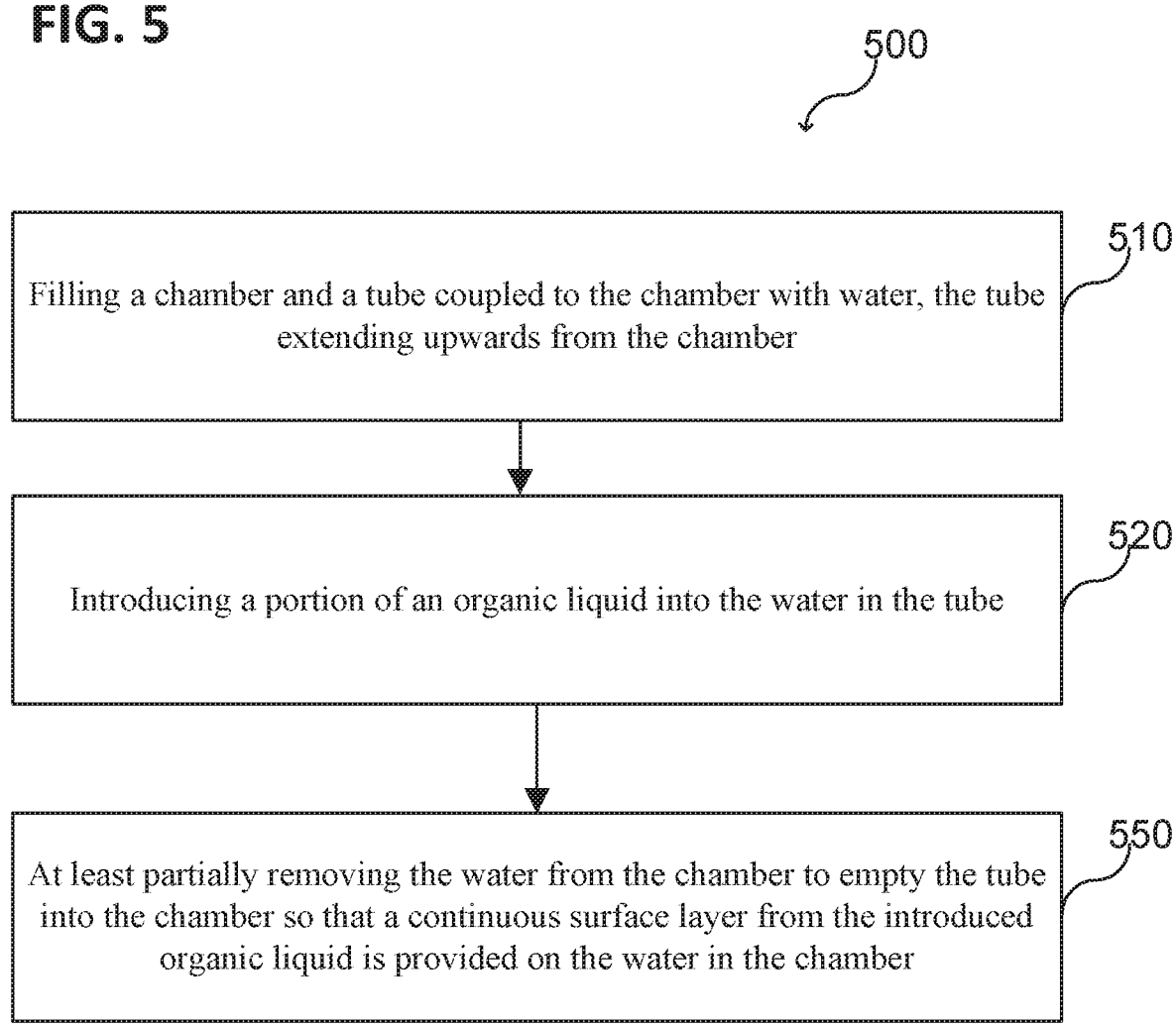
FIG. 5 shows a schematic flow diagram of a method for processing a carrier, according to various embodiments.

FIG. 5 illustrates a method 500 in a schematic flow diagram, e.g. a method 500 for drying a carrier or a method 500 for processing a carrier, according to various embodiments, wherein the method 500 may include: in 510, filling a chamber (e.g. a chamber 102, 102b, 302 as described herein) and a tube (e.g. an inlet structure 102m, 302m as described herein) coupled to the chamber with water, wherein the tube may extend upwards from the chamber; in 520, introducing a portion of an organic liquid into the water in the tube (e.g. into the merging region 104m as described herein); and, in 530, at least partially removing the water from the chamber to empty the tube into the chamber so that a continuous surface layer from the introduced organic liquid is provided on the water in the chamber.

According to various embodiments, the method 500 may include: in 510, filling a chamber (e.g. a chamber 102, 102b, 302 as described herein) and a tube (e.g. an inlet structure 102m, 302m as described herein) coupled to the chamber with a first liquid, wherein the tube may extend upwards from the chamber; in 520, introducing a portion of a second liquid into the first liquid in the tube (e.g. into the merging region 104m as described herein); and, in 530, at least partially removing the first liquid from the chamber to empty the tube into the chamber so that a continuous surface layer from the introduced second liquid is provided on the first liquid in the chamber.

According to various embodiments, the second liquid may be a surface reducing agent for the first liquid. According to various embodiments, the second liquid may include a surfactant.

According to various embodiments, a method for processing a wafer may include: filling a first region 104p of a chamber and a second region 104m of a chamber over the first region 104p with water 204, wherein at least one wafer is accommodated in the first region 104p of the chamber; introducing a portion of an organic liquid 206 into the water 204 in the second region 104m of the chamber; at least partially removing the water 204 from the first region 104m of the chamber to lower a water level from the second region 104m to the first region 104p to provide a continuous surface layer from the organic liquid 206 on the water 204 in the first region 104p of the chamber.

According to various embodiments, the portion 206 of the organic liquid may be introduced into the water 204 in the tube (in the merging region 104m of the inlet structure 302m) such that the introduced organic liquid 206 may be substantially separated from the water 204. Further, according to various embodiments, the portion of the organic liquid 206 may be introduced into the water 204 in the tube such that the introduced organic liquid 206 may be substantially covering the surface 204s of the water 204 in the tube. Further, according to various embodiments, nitrogen may be introduced into the tube while the water may be removed from the chamber to avoid a vacuum in the tube.

Further, according to various embodiments, the water may be continuously drained from the chamber to continuously (or partly continuously) lower the level of the water in the tube and subsequently to continuously lower the level of the water in the chamber, wherein the water in the chamber is completely covered with a surface layer of the organic liquid 206.

According to various embodiments, at least one wafer may be provided in the chamber before the chamber and the tube are filled with water. Further, to dry the at least one wafer, the water level may be lowered in the chamber such that the at least one wafer is exposed. Due to the organic liquid layer covering the water during the at least one wafer is exposed, the Marangoni effect is utilized to leave the at least one wafer clean and dry.

Various modifications and/or configurations of the processing device 100, 300 and/or details referring to the method 500 are described in the following, wherein the features and/or functionalities as described before may be included analogously. Further, the features and/or functionalities described in the following may be included in the processing device 100, 300 and/or the method 500 as described before.

FIGS. 6A to 6G illustrate a sequence of operating the processing device 100, e.g. a processing device 100 as described with reference to FIG. 1A and FIG. 1B, and FIGS. 2A to 2E.

The processing device 100 illustrated in FIGS. 6A to 6G may include a chamber 102 for accommodating the at least one carrier or at least one wafer. The chamber 102 may include an opening 602i at the top of the chamber 102 to connect the chamber 102 to an inlet structure 102m. The inlet structure 102m may include a pipe structure extending from the opening 602i at the top of the chamber 102. Further, according to various embodiments, the inlet structure 102m may provide a merging region 104m (within the pipes of the pipe structure), wherein the pipes (or tubes) of the inlet structure 102m which provide the merging region 104m may have a smaller cross sectional diameter than the horizontal extension of the chamber 102 providing the processing region. According to various embodiments, the pipes (or tubes) of the inlet structure 102m which provide the merging region 104m may have a smaller cross sectional diameter than 10 cm for introducing a portion of the organic liquid into the water in the inlet structure 102m.

According to various embodiments, the processing device 100 may include a control arrangement 106 coupled to the chamber, wherein FIG. 6A illustrates at least a part of the control arrangement 106 coupled to the inlet structure 102m. According to various embodiments, the control arrangement 106 may include the second flow control structure 116b coupled to the inlet structure 102m, as already described. The control arrangement 106 or the second flow control structure 116b may include for example three valves 606a, 606b, 606c or more than three valves. Illustratively, the control arrangement 106 may include a multichannel flow control structure 116b. According to various embodiments, the inlet structure 102m may include a manifold 604m connected to the chamber 102 (via an upper transition 602t) and to the second flow control structure 116b. The inlet structure 102m or the manifold 604m may be connected to one or more valves, for example to three valves 606a, 606b, 606c.

According to various embodiments, the control arrangement 106 may be configured to insert nitrogen into the inlet structure 102m (into the manifold 604m) through the first valve 606a. Further, the control arrangement 106 may be configured to insert the second liquid (e.g. the organic liquid) into the inlet structure 102m (into the manifold 604m) through the second valve 606b. Further, the second flow controller 116b may be configured to drain the first liquid (e.g. water) from the inlet structure 102m (from the manifold 604m) through the third valve 606c. The control arrangement 106 may include a controller, e.g. a microcontroller or a microprocessor, for controlling (e.g. to open and close) the valves 606a, 606b, 606c, wherein the valves may be supported with the liquids or the gas from accordingly provided reservoirs. The control arrangement 106 may further include a controller for controlling a pump system connected to the chamber 102 to flood and/or drain the chamber 102 with the first liquid.

According to various embodiments, the tube of the inlet structure 102m (or of the manifold) extending upwards from the chamber providing the merging region 104m may be tilted from the vertical, e.g. with a tilt angle in the range from about 0° to about 90°, or with a tilt angle in the range from about 0° to about 45°, or with a tilt angle in the range from about 0° to about 30°, e.g. with a tilt angle of about 12°.

According to various embodiments, the inlet structure 102m of the processing device 100 may include a drain 606d, wherein the drain 606d may be branched off in a different direction than the manifold 604m.

FIG. 6A shows the processing device 100 at a first (without loss of generality) processing stage of a drying process or of an operation cycle, wherein the three valves 606a, 606b, 606c and the drain 606d are closed and wherein the inlet structure 102m is drained.

Figure 6B:
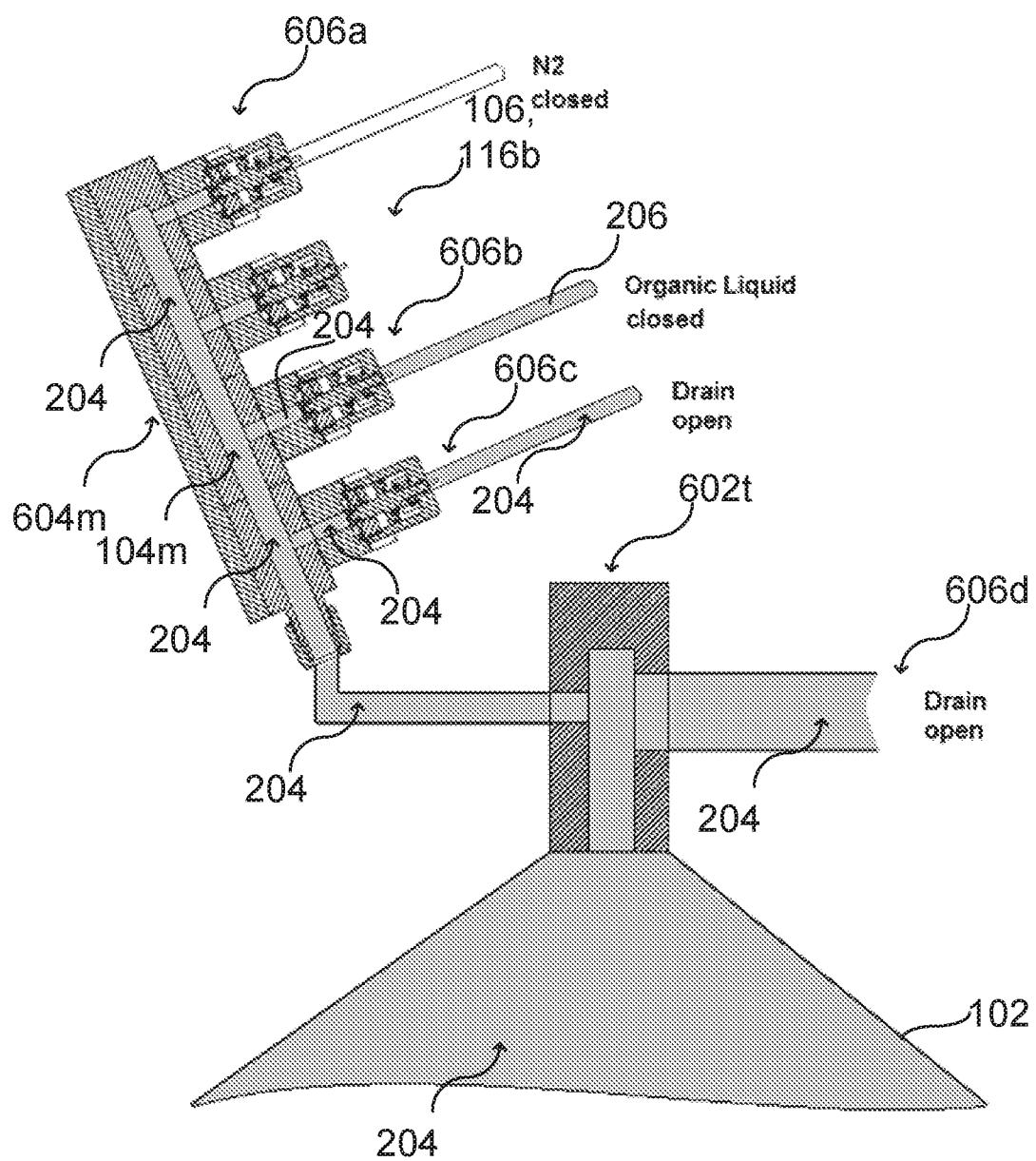

As illustrated in FIG. 6B, the process chamber 102 (the chamber 102), the upper transition 602t, the manifold 604m and the drains 606c, 606d may be filled with the first liquid 204. Illustratively, the level of the first liquid 204 in the chamber 102 may be raised until the inlet structure 102m (or the manifold 604m) is filled with the first liquid 204. In other words, the first liquid 204 may be provided in the merging region 104m provided over the processing region 104p in the chamber 102.

Figure 6C:
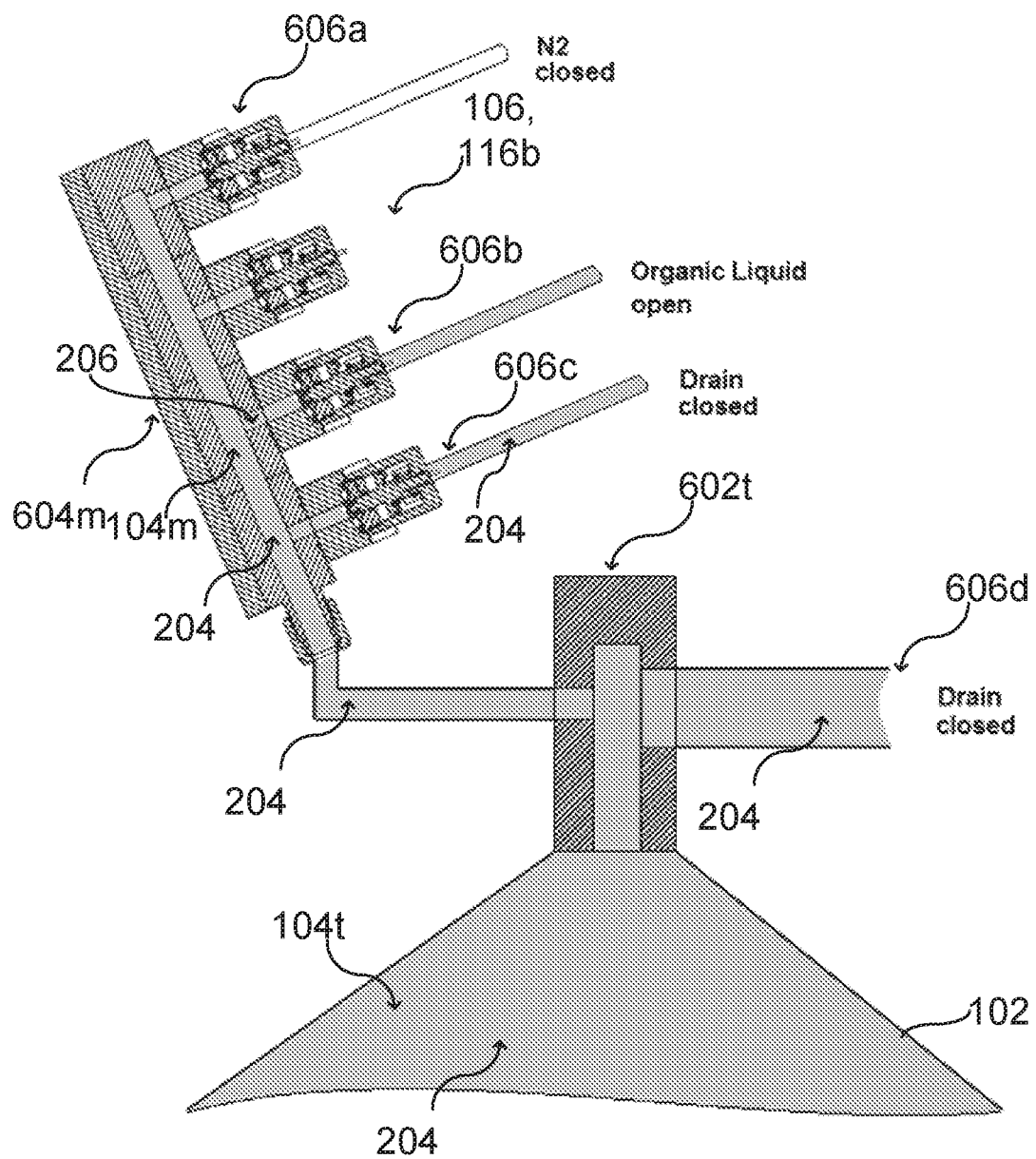

FIG. 6C illustrates the impact of the second liquid 206 on the first liquid 204, when the second liquid 206 is inserted into the inlet structure 102m (or the manifold 604m) according to various embodiments. At this stage, the drains 606c, 606d may be closed and the second valve 606b (the valve to insert the second liquid 206) may be opened. According to various embodiments, the second liquid 206 may be provided from a reservoir to the second valve 606b. If the second valve 606b is opened, the second liquid 206 may flow into the merging region 104m. The second liquid 206 may be under pressure (e.g. provided by a pump) such that the second liquid 206 may flow into the inlet structure 102m (or the manifold 604m) or the second liquid 206 may be sucked out from the reservoir into the inlet structure 102m (or the manifold 604m), when the first liquid 204 is pumped of the chamber 102.

The inlet structure 102m (or the manifold 604m) may provide a merging region 104m with a cylindrical shape having a diameter of about ¾ inch. Therefore, the surface of the first liquid 204 may be very small such that a mixing of both liquids 204, 206 in the merging region 104m may be substantially prevented.

Figure 6D:
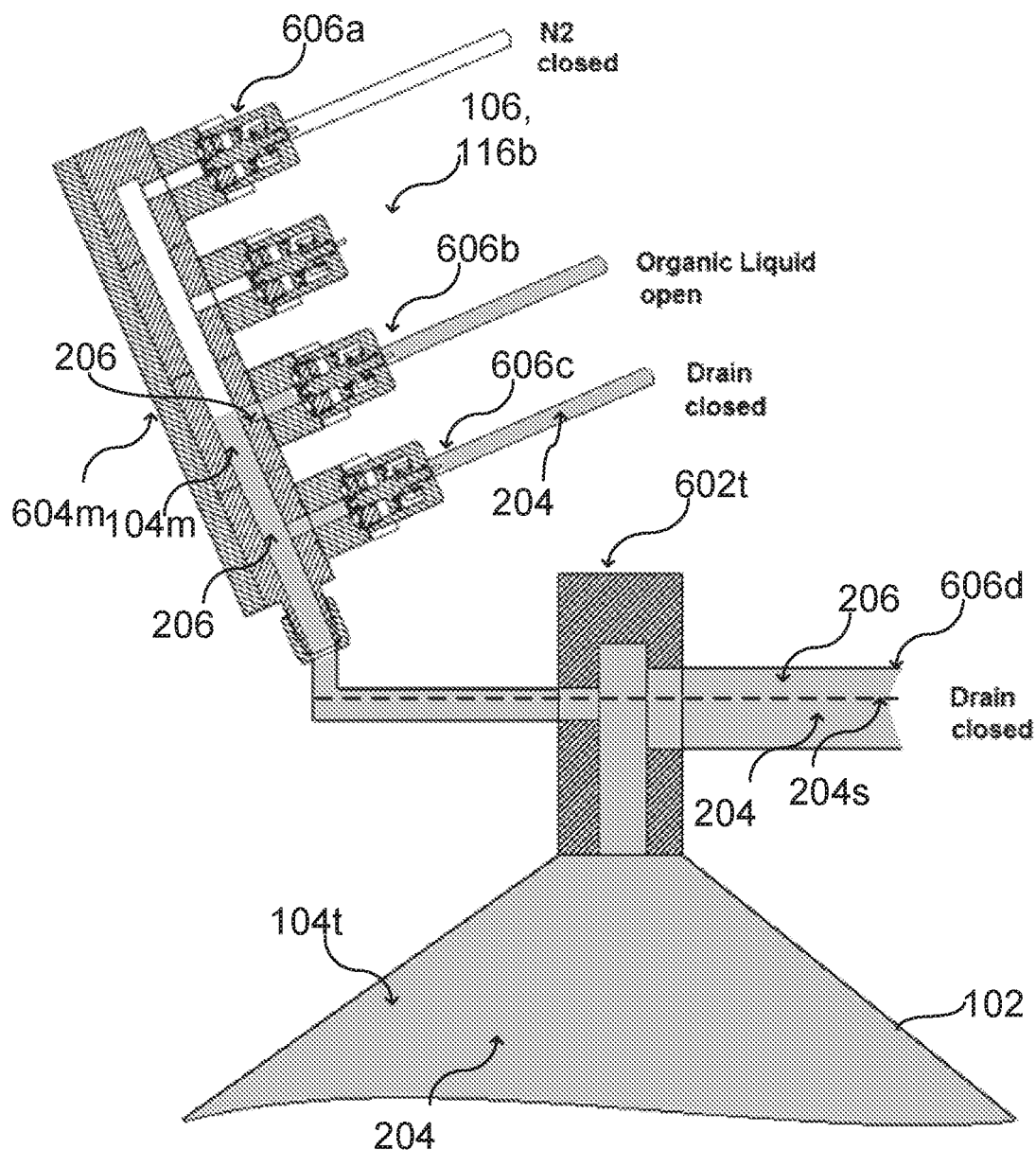

FIG. 6D illustrates the processing device 100 at a further processing stage of building a portion of the second liquid 206 over the first liquid 204 according to various embodiments. The first liquid 204 may be drained from the chamber with a first drain speed (related to the vertical direction) such that the level of the first liquid 204 is lowered (the first liquid 204 may be pumped of the chamber 102) and the second liquid 206 may flow behind (the second liquid 206 may continue to flow through the second valve 606b). According to various embodiments, after a first draining period (a first flow time), the draining may be stopped (the pump stops) and a first wait (with a first wait time) begins. According to various embodiments, during the building of the portion of the second liquid 206 over the first liquid 204, as illustrated in FIG. 6D, the first drain speed may be in the range from about 0.5 cm/min to about 5.0 cm/min, e.g. about 3 cm/min. Further, the first draining period may be in the range from about 1 s to about 10 s, e.g. about 1 s or greater than about 1 s. Further, the first wait time may be in the range from about 1 s to about 60 s, e.g. about 20 s or greater than about 20 s, e.g. about 28 s.

Figure 6E:
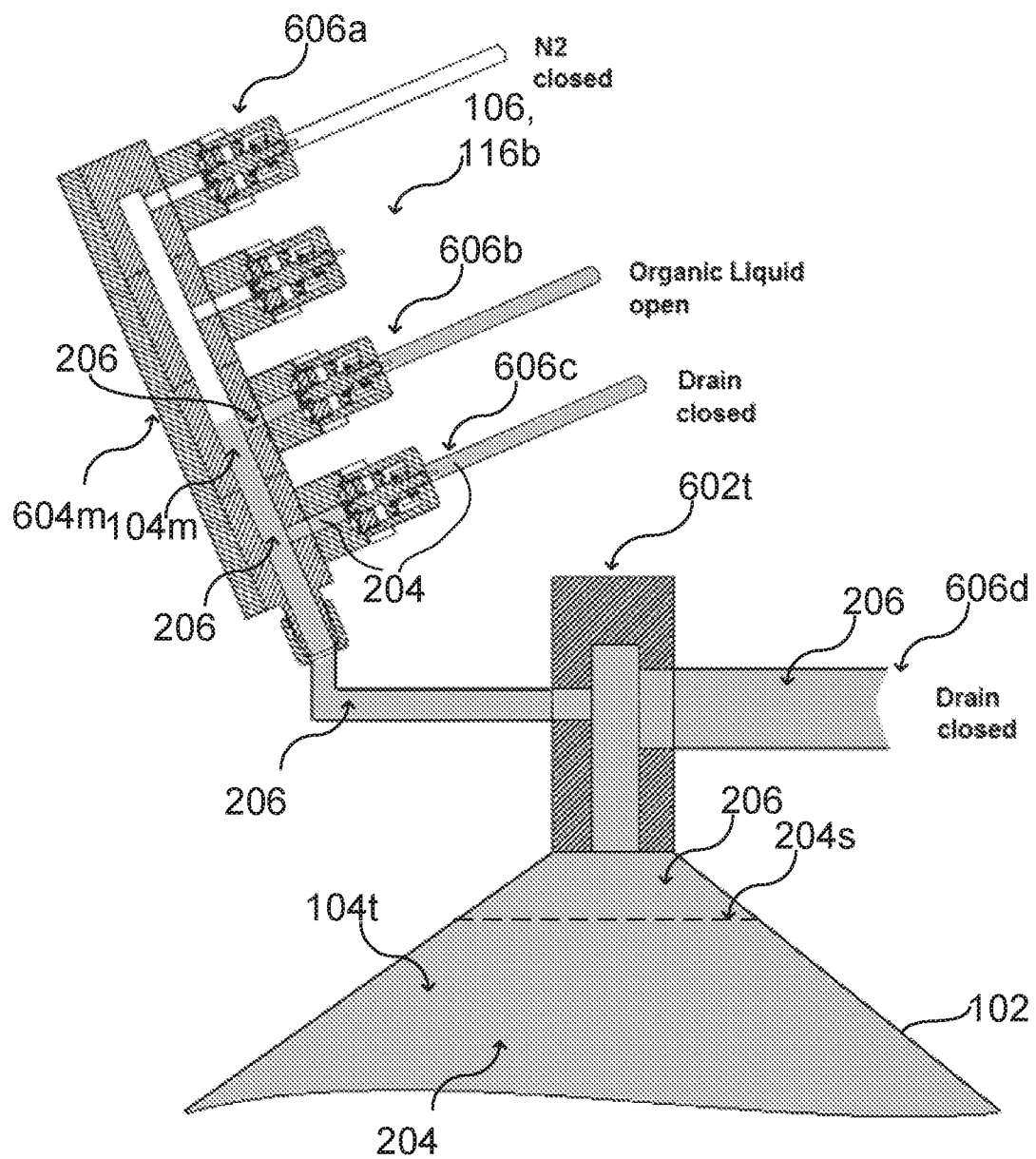

FIG. 6E illustrates the processing device 100 at a further processing stage of feeding the portion of the second liquid 206 over the first liquid 204 according to various embodiments. After the first wait time, the first liquid 204 may be drained further with a second drain speed (the first liquid 204 may be further pumped of the chamber 102) for a second draining period (a second flow time), wherein the portion of the second liquid 206 over the first liquid 204 may be fed through the second valve 606b (the second liquid 206 may continue to flow through the second valve 606b). The interface 204s between the first liquid 204 and the second liquid 206 may be lowered from the upper transition 602t (as illustrated in FIG. 6D) into the chamber 102 or into the transition region 104t of the chamber 102 (as illustrated in FIG. 6E). According to various embodiments, during the feeding of the portion of the second liquid 206 the second drain speed may be in the range from about 0.5 cm/min to about 5 cm/min, e.g. about 3 cm/min. Further, the second draining period may be in the range from about 1 s to about 60 s, e.g. about 20 s or greater than about 20 s, e.g. about 24 s.

Figure 6F:
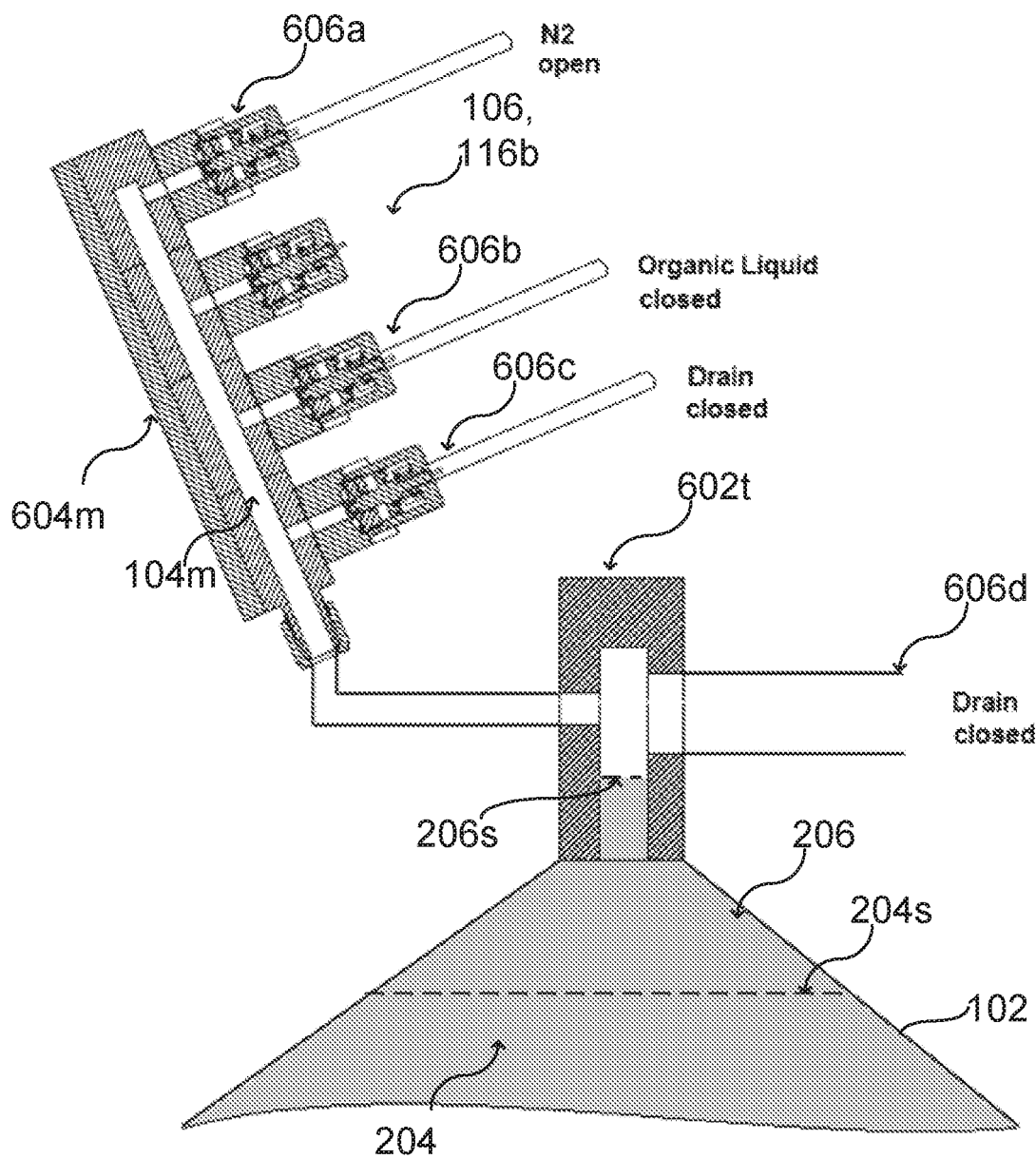

FIG. 6F illustrates the processing device 100 at a further processing stage of building a surface layer of the second liquid 206 over the first liquid 204 according to various embodiments. According to various embodiments, after a predefined volume of the second liquid has been introduced into the inlet structure 102m (or the manifold 604m), the second valve 606b feeding the second liquid 206 may be closed. According to various embodiments, the amount (the predefined volume) of the second liquid 206 may be in the range from about 25 ml to about 1000 ml, e.g. about 410 ml. The amount of the second liquid 206 to be inserted into the chamber 102 may depend on the horizontal extension 101p and the thickness of the surface layer to be provided by the second liquid 206 over the first liquid 204 in the processing region 104p of the chamber 102.

If the second valve 606b is closed, the first valve 606a may be opened to insert nitrogen or another gas into the inlet structure 102m (or the manifold 604m) according to various embodiments.

Figure 6G:
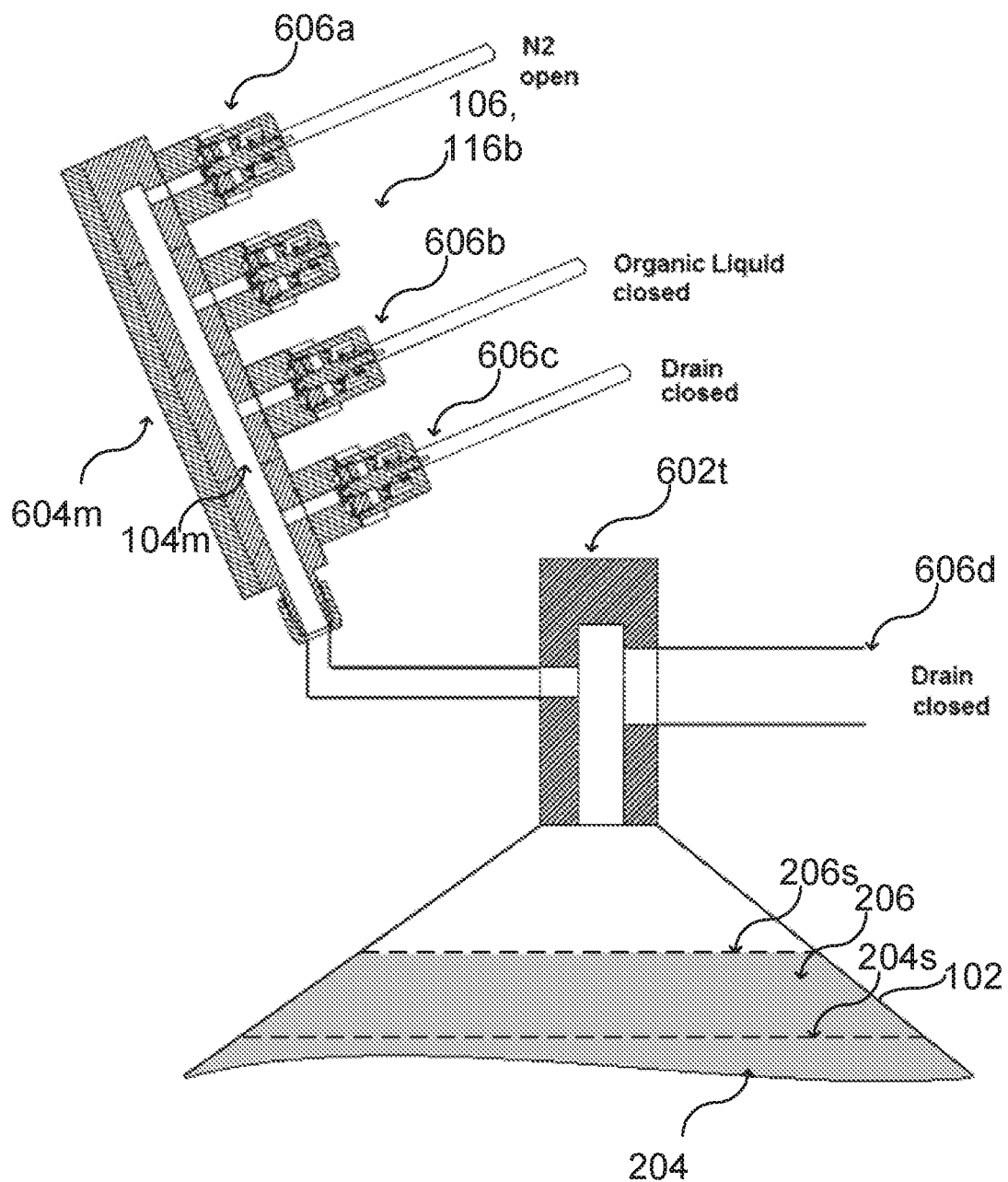

FIG. 6G illustrates the processing device 100 at a further processing stage of completing the surface layer of the second liquid 206 over the first liquid 204 according to various embodiments. According to various embodiments, with feeding of nitrogen and further pumping of the first liquid 204, the surface 206s of the second liquid 206 may grow and the layer 206 of the second liquid 206 may get the desired thickness. The thickness (along the vertical direction) of the second liquid layer in the processing region 104p of the chamber 102 may be in the range from about 1 mm to about 10 mm, e.g. in the range from about 3 mm to about 9 mm.

Further, after the layer 206 of the second liquid 206 is formed over the first liquid 204, the wafer or the carrier in the processing region 104p of the chamber 102 may be dried, e.g. by lowering the level of the first liquid 204 with a third drain speed for a third drain period such that the wafer or the carrier in the processing region 104p of the chamber 102 may be exposed. Due to the second liquid layer provided over the first liquid the Marangoni effect may be utilized to dry the wafer or the carrier in the processing region 104p of the chamber 102.

According to various embodiments, during the drying the third drain speed may be in the range from about 0.5 cm/min to about 5 cm/min, e.g. about 3 cm/min. Further, the third draining period may be in the range from about 300 s to about 1200 s, e.g. about 450 s. During the drying, the interface 204s between the first liquid 204 and the second liquid 206 may go vertically down on the wafer and an additional feeding of nitrogen through the first valve 606a may provide a pressure compensation.

After the drying, according to various embodiments, all remaining liquids 204, 206 may be drained (pumped out of the chamber 102), wherein an additional feeding of nitrogen through the first valve 606a may provide a pressure compensation. Further, according to various embodiments, all remaining liquids 204, 206 may be drained from the inlet structure 302m or from the manifold 704m after the drying.

Further, according to various embodiments, the chamber 102 and/or the inlet structure 102m may be purged with nitrogen or another gas after drying the carrier and draining all remaining liquids. Due to the purging, small amounts of remaining liquids or drops may be vaporized and all vapors may go out into an exhaust. Therefore, according to various embodiments, the processing device 100 may include an exhaust for purging the chamber 102 and/or the inlet structure 102m by the first valve 606a and the exhaust. According to various embodiments, the purging may be performed for a purging duration in the range from about 10 s to about 500 s. Therefore, a nitrogen gas flow may be provided in the range from about 1 l/min to about 500 l/min.

According to various embodiments, the chamber 102 and/or the inlet structure 102m may be vented after purging. Due to the venting, a pressure compensation may be provided between the inside of the chamber 102 and the outside of the chamber. According to various embodiments, the chamber 102 and/or the inlet structure 102m may be provided air tight.

Figure 6H:
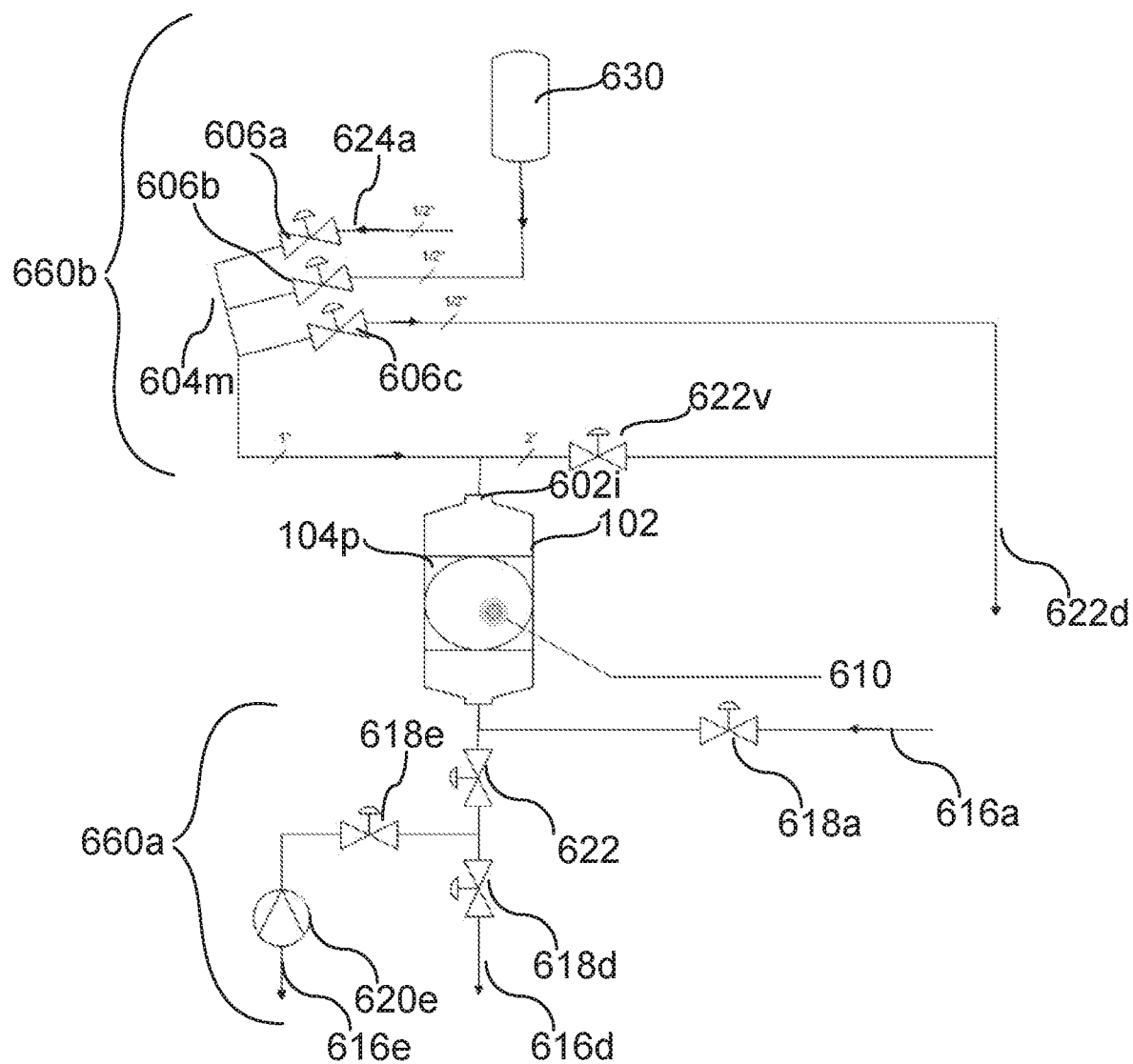
FIG. 6H shows a schematic pipe and valve layout of the processing device according to various embodiments.

FIG. 6H shows a schematic pipe and valve layout 600 of the processing device 100 described with reference to FIGS. 6A to 6G according to various embodiments. According to various embodiments, at least one wafer 610 may be accommodated in the processing region 104p of the chamber 102. According to various embodiments, the control arrangement 660a (or the first flow control structure or the first liquid control arrangement) coupled to the chamber 102 (e.g. to the bottom of the chamber 102) may include a first inlet 616a for providing the first liquid 204 in the chamber 102, e.g. to fill the chamber 102 with the first liquid 204. The first inlet 616a may be controlled by a first inlet valve 618v.

According to various embodiments, the control arrangement 660a coupled to the chamber 102 (e.g. to the bottom of the chamber 102) may include a first drain 616d, e.g. for draining the liquids 204, 206 from the chamber 102, e.g. to drain the first liquid from the chamber 102 to lower the interface 204s between the two liquids 204, 206 in the chamber 102. The first drain 616d may be controlled by a first drain valve 618d. Further, according to various embodiments, the first drain 616d may be coupled to a pump for pumping liquids out of the chamber 102. According to various embodiments, the control arrangement 660a coupled to the chamber 102 (e.g. to the bottom of the chamber 102) may include an exhaust 616e, e.g. for purging the chamber 102. The exhaust 616e may be controlled by an exhaust valve 618e and an exhaust pump 620e. Further, the first drain 616d and the exhaust 616e may be separated from the chamber 102 and coupled to the chamber 102 via an additional valve 622. The additional valve 622 may be for example closed during filling the chamber 102 with the first liquid 204 by the first inlet 616a.

According to various embodiments, the control arrangement 660b (or the second flow control structure or the second liquid control arrangement) coupled to the chamber 102 (e.g. to the opening 602i at the upper side of the chamber 102) may include a manifold 604m and three valves 606a, 606b, 606c as described herein with reference to FIGS. 6A to 6G. According to various embodiments, the manifold 604m may be coupled to a reservoir 630 for the second liquid 206 via a second inlet valve 606b and to a second drain 622d via a second drain valve 606c. Further, the manifold 604m may be coupled to a gas supply 624a (to a nitrogen source) via a gas valve 606a. Further, the control arrangement 660b may include a direct connection from the opening 602i of the chamber 102 to the second drain 622d controlled for example by a third drain valve 622v.

As illustrated in FIG. 6H, the reservoir 630 may include an opening so that clean air or another gas can enter the reservoir 630 during the reservoir 630 is drained into the manifold 604. Thus, it can be prevented that a vacuum (a pressure less than about 1 bar) is created in the reservoir 630 during the second liquid 206 is drained from the reservoir 630. Further, the reservoir 630 may include a controlled gas inlet so that a pressure (a gas pressure) in the reservoir 630 may be controlled during 630 during the second liquid 206 is drained from the reservoir 630, e.g. during the second liquid 206 is inserted into the manifold 604. Illustratively, pressure compensation may be provided in the reservoir 630, e.g. by introducing clean air from a clean air reservoir or nitrogen (e.g. pure nitrogen) into the reservoir 630 (e.g. controlled by using a valve or only by pressure equalization to the environment), to compensate a volume of the second liquid 206 drained from the reservoir 630.

FIGS. 7A to 7G illustrate a sequence of operating the processing device 300, e.g. a processing device 300 as described with reference to FIG. 3, and FIGS. 4A to 4D.

The processing device 300 illustrated in FIGS. 7A to 7G may include a tank 302 with a processing region 104p for accommodating the at least one carrier or at least one wafer. The upper side of the tank 302 may be open which may allow the inlet structure 302m to extend into the tank 302, e.g. to extend to or into the processing region 104p of the tank 302. The inlet structure 302m may include a pipe structure, e.g. a 3/2-way valve. Further, according to various embodiments, the inlet structure 102m may provide a merging region 104m (within the pipes of the pipe structure or within the 3/2-way valve), wherein merging region 104m may have a smaller cross sectional diameter than the horizontal extension of the tank 302 providing the processing region. According to various embodiments, the pipes (or tubes) of the inlet structure 302m which provide the merging region 104m may have a smaller cross sectional diameter than 10 cm for introducing a portion of the organic liquid into the water in the inlet structure 102m.

Figure 7A:
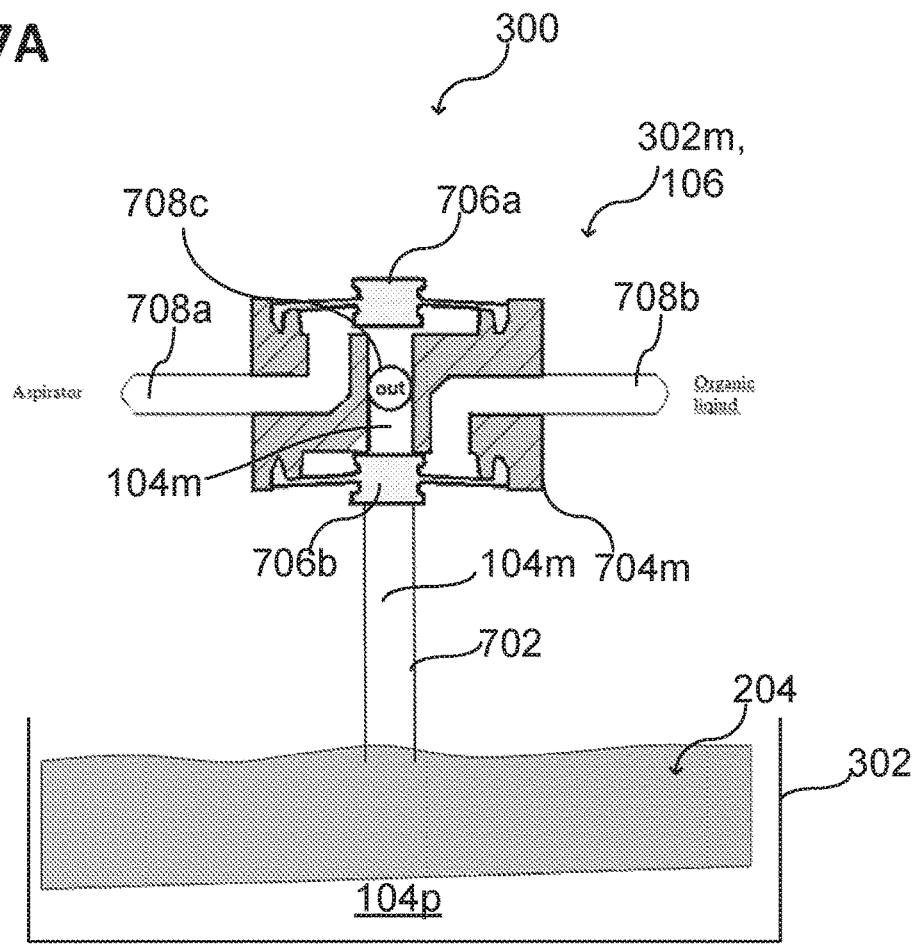
FIGS. 7A to 7G respectively show a processing device at various steps during operation according to various embodiments.

FIG. 7A shows the processing device 300 at a first (without loss of generality) processing stage of a drying process or of an operation cycle, wherein the inlet structure 302m is completely drained. According to various embodiments, the inlet structure 302m of the chamber 302 may include a manifold 704m, a tube 702 (a riser) extending for example vertically towards the processing region 104p of the tank 302, a first connection pipe 708a connected to an aspirator (a liquid aspirator or an aspirator pump), and a second connection pipe 708b connected to a reservoir for the second liquid. According to various embodiments, the inlet structure 302m may further include a drain 708c or an exhaust 708c. According to various embodiments, the inlet structure 302m may further include a first valve 706a and a second valve 706b. In other words, the inlet structure 302m may be coupled with a control arrangement, the control arrangement including the first valve 706a and the second valve 706b. The control arrangement may further include a controller for controlling the valves. The control arrangement may further include a controller for controlling the aspirator. Illustratively, the manifold 704m with the first valve 706a and the second valve 706b may provide a 3/2-way valve.

Figure 7B:
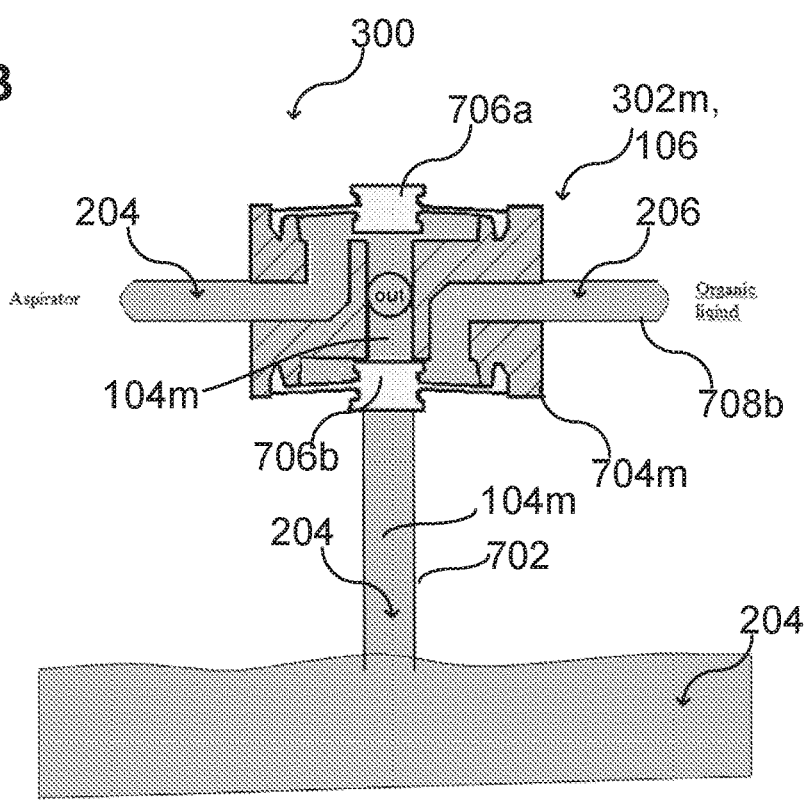

As illustrated in FIG. 7B, the first liquid 204 (e.g. water) may be provided in the manifold 704m by operating the aspirator coupled to the manifold 704m. Thereby, the first valve 706a is open and the second valve 706b is closed (in a first switching state of the 3/2-way valve) such that the first liquid can be provided within (or sucked in) the merging region 104m of the inlet structure 302m or provided within (or sucked in) the manifold 704m. Further, the second liquid 206 (e.g. an organic liquid) may be provided by the second connection pipe 708b, wherein the introduction of the second liquid 206 into the merging region 104m of the inlet structure 302m may be controlled by the second valve 706b.

Figure 7C:
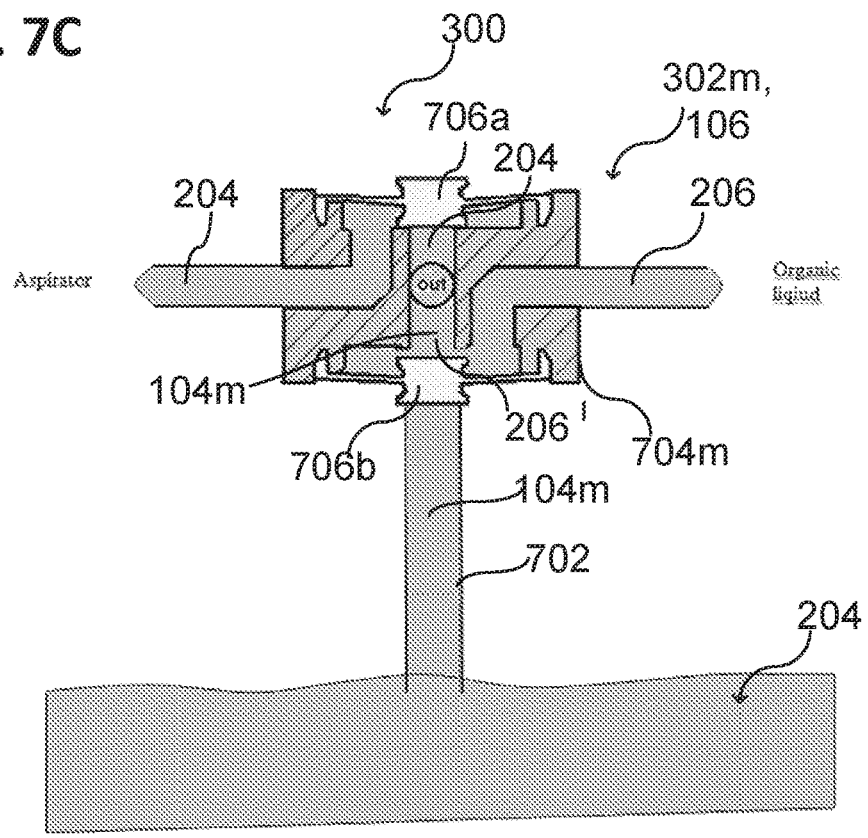

FIG. 7C illustrates the impact of the second liquid 206 on the first liquid 204 when the second liquid 206 is inserted into the inlet structure 102m (or the manifold 604m) according to various embodiments. According to various embodiments, the second valve 706b may be opened (e.g. the 3/2-way valve may be switched into a second switching state, wherein the first valve 706a may be closed and the second valve 706b may be opened) to introduce the second liquid 206 into the merging region 104m of the inlet structure 302m. Since to volume in the inlet structure 302m or manifold 704m may be small, the first liquid 204 and the second liquid 206 may substantially not mixing each other. Illustratively, a portion of the second liquid 206 may be introduced into the manifold 704m.

Figure 7D:
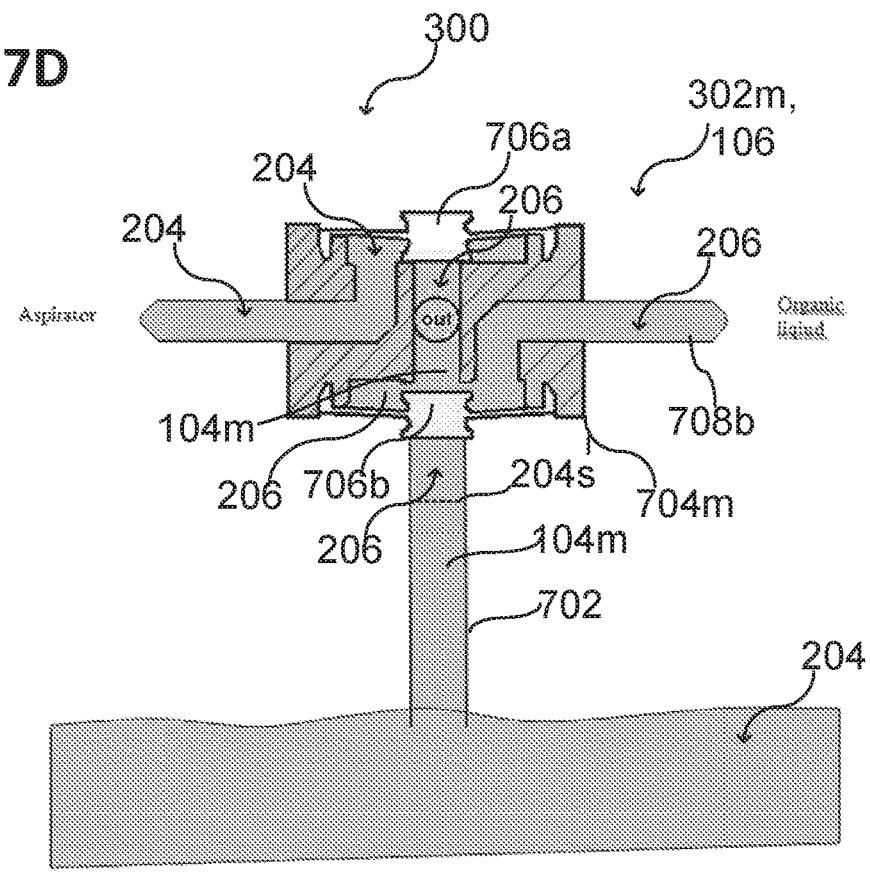

FIG. 7D illustrates the processing device 300 at a further processing stage of building a portion of the second liquid 206 over the first liquid 204 according to various embodiments. The first liquid 204 may be drained from the inlet structure 302m (e.g. from the tube 702 and the manifold 704m) with a first drain speed (related to the vertical direction) such that the level of the first liquid 204 is lowered and the second liquid 206 flows behind (the second liquid 206 continues to flow through the second valve 706b). According to various embodiments, the first liquid 204 may go down due to gravity, e.g. controlled by a nitrogen pressurization on the second liquid reservoir coupled to the second connection pipe 708b.

According to various embodiments, after a first draining period (a first flow time) the draining may be stopped (e.g. the nitrogen pressurization in the second liquid reservoir may be stopped by closing a control valve) and a first wait (with a first wait time) begins. According to various embodiments, during the built of the portion of the second liquid 206 over the first liquid 204, as illustrated in FIG. 7D, the first drain speed may be in the range from about 0.5 cm/min to about 5.0 cm/min, e.g. about 3 cm/min. Further, the first draining period may be in the range from about 1 s to about 10 s, e.g. about 1 s or greater than about 1 s. Further, the first wait time may be in the range from about 1 s to about 60 s.

Figure 7E:
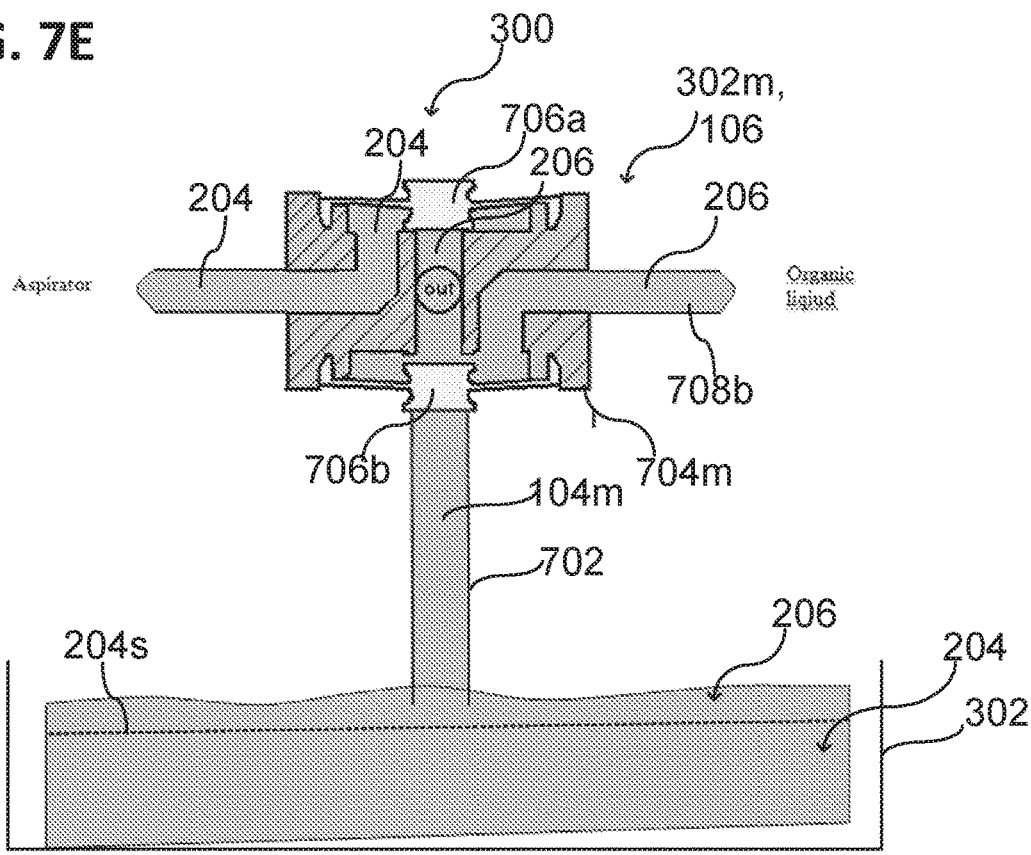

FIG. 7E illustrates the processing device 300 at a further processing stage of feeding the portion of the second liquid 206 over the first liquid 204 according to various embodiments. After the first wait time, the first liquid 204 may be drained further with a second drain speed (the first liquid 204 may go further down by gravity) for a second draining period (a second flow time), wherein the portion of the second liquid 206 over the first liquid 204 may be fed through the second valve 706b (the second liquid 206 continues to flow through the second valve 706b). The interface 204s between the first liquid 204 and the second liquid 206 may be lowered from the inlet structure 302m (as illustrated in FIG. 6D) into the tank 302 (as illustrated in FIG. 6E). According to various embodiments, during the feeding of the portion of the second liquid 206 the second drain speed may be in the range from about 0.5 cm/min to about 5 cm/min, e.g. about 3 cm/min. Further, the second draining period may be in the range from about 1 s to about 60 s.

Figure 7F:
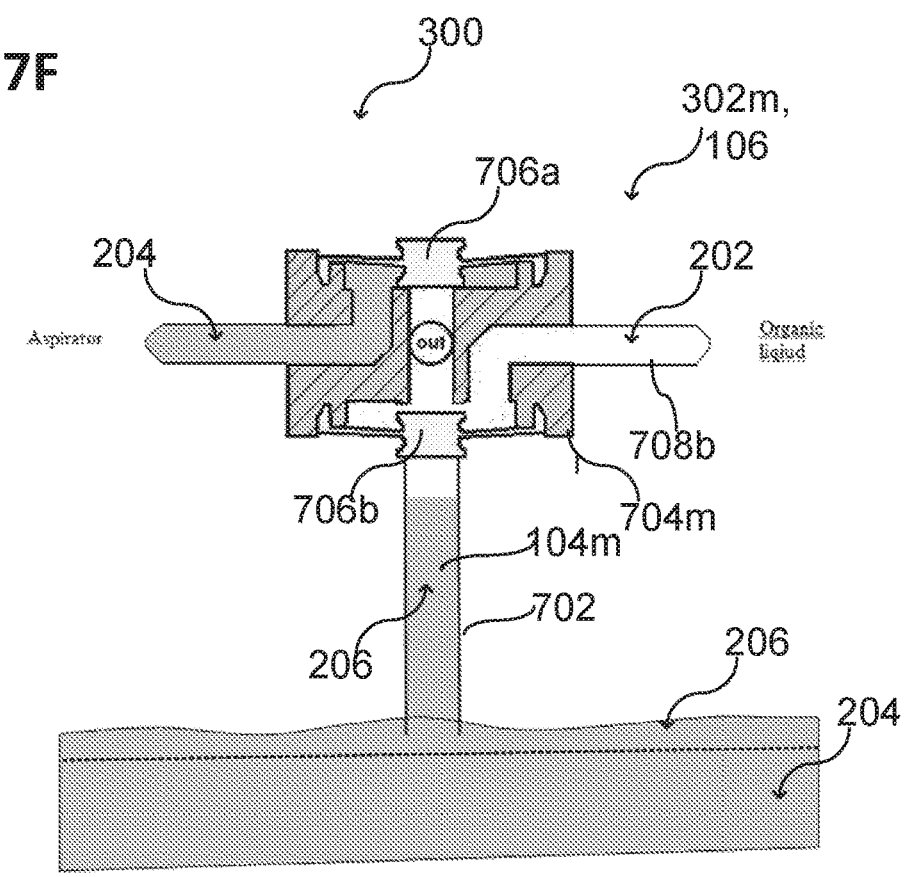

FIG. 7F illustrates the processing device 100 at a further processing stage of building a surface layer of the second liquid 206 over the first liquid 204 according to various embodiments. According to various embodiments, after a predefined volume of the second liquid 206 has been introduced into the inlet structure 302m (or the manifold 704m), the reservoir with the second liquid may be closed such that no further second liquid may be provided to the manifold 704m via the second connection pipe 708b. According to various embodiments, nitrogen may be provided at the second connection pipe 708b. According to various embodiments, the amount (the predefined volume) of the second liquid 206 may be in the range from about 25 ml to about 1000 ml. The amount of the second liquid 206 to be inserted into the chamber 102 may depend on the horizontal extension 101p and the thickness of the surface layer to be provided by the second liquid 206 over the first liquid 204 in the processing region 104p of the tank 302.

Figure 7G:
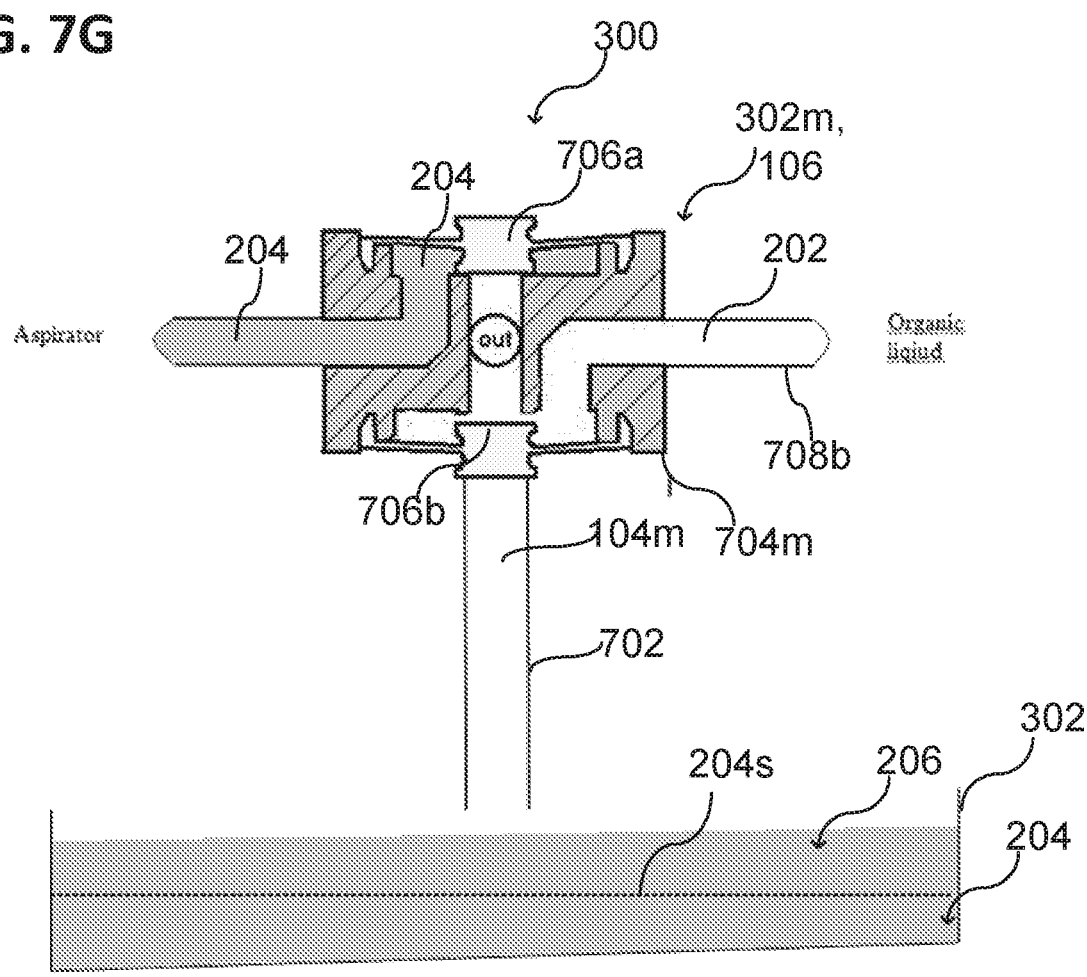

FIG. 7G illustrates the processing device 300 at a further processing stage of completing the surface layer of the second liquid 206 over the first liquid 204 according to various embodiments. According to various embodiments, with further feeding nitrogen through the second connection pipe 708b, the second liquid 206 may spread (or lay out) and cover the surface 204s of first liquid 204 in the tank 302.

According to various embodiments, the thickness (along the vertical direction) of the second liquid layer 206 (as illustrated for example in FIG. 7G) in the processing region 104p of the tank 302 may be in the range from about 1 mm to about 10 mm, e.g. in the range from about 3 mm to about 9 mm.

Further, after the layer 206 of the second liquid 206 is formed over the first liquid 204, the wafer or the carrier in the processing region 104p of the tank 302 may be dried, e.g. by lowering the level of the first liquid 204 with a third drain speed for a third drain period such that the wafer or the carrier in the processing region 104p of the tank 302 may be exposed. Due to the second liquid layer 206 provided over the first liquid 204 (as illustrated for example in FIG. 7G) the Marangoni effect may be utilized to dry the wafer or the carrier in the processing region 104p of the tank 302.

According to various embodiments, during the drying the third drain speed may be in the range from about 0.5 cm/min to about 5 cm/min. Further, the third draining period may be in the range from about 300 s to about 1200 s. During the drying, the interface 204s between the first liquid 204 and the second liquid 206 may go vertically down on the wafer and an additional feeding of nitrogen through the second connection pipe 708b may provide a pressure compensation and may blow out all vapors from the inlet structure 302m or the manifold 704m.

Further, according to various embodiments, after the drying, all remaining liquids 204, 206 may be drained (pumped out of the chamber 102), wherein an additional feeding of nitrogen through the second connection pipe 708b may provide a pressure compensation. Further, according to various embodiments, after the drying, all remaining liquids 204, 206 may be drained from the inlet structure 302m or from the manifold 704m.

Further, according to various embodiments, after drying the carrier and draining all remaining liquids, the tank 302 (chamber 302) and/or the inlet structure 302m (or the manifold 704m) may be purged with nitrogen or another gas. Due to the purging, small amounts of remaining liquids or drops may be vaporized and all vapors may go out into an exhaust. Therefore, according to various embodiments, the processing device 300 may include an exhaust for purging the tank 302 and/or the inlet structure 302m. According to various embodiments, the purging may be performed for a purging duration in the range from about 10 s to about 500 s. Therefore, a nitrogen gas flow may be provided in the range from about 1 l/min to about 500 l/min.

According to various embodiments, the tank 302 and/or the inlet structure 302m may be vented after purging. Due to the venting, a pressure compensation may be provided between the inside of the tank 302 and/or the inlet structure 302m and the outside of the tank 302 and/or the inlet structure 302m.

Figure 7H:
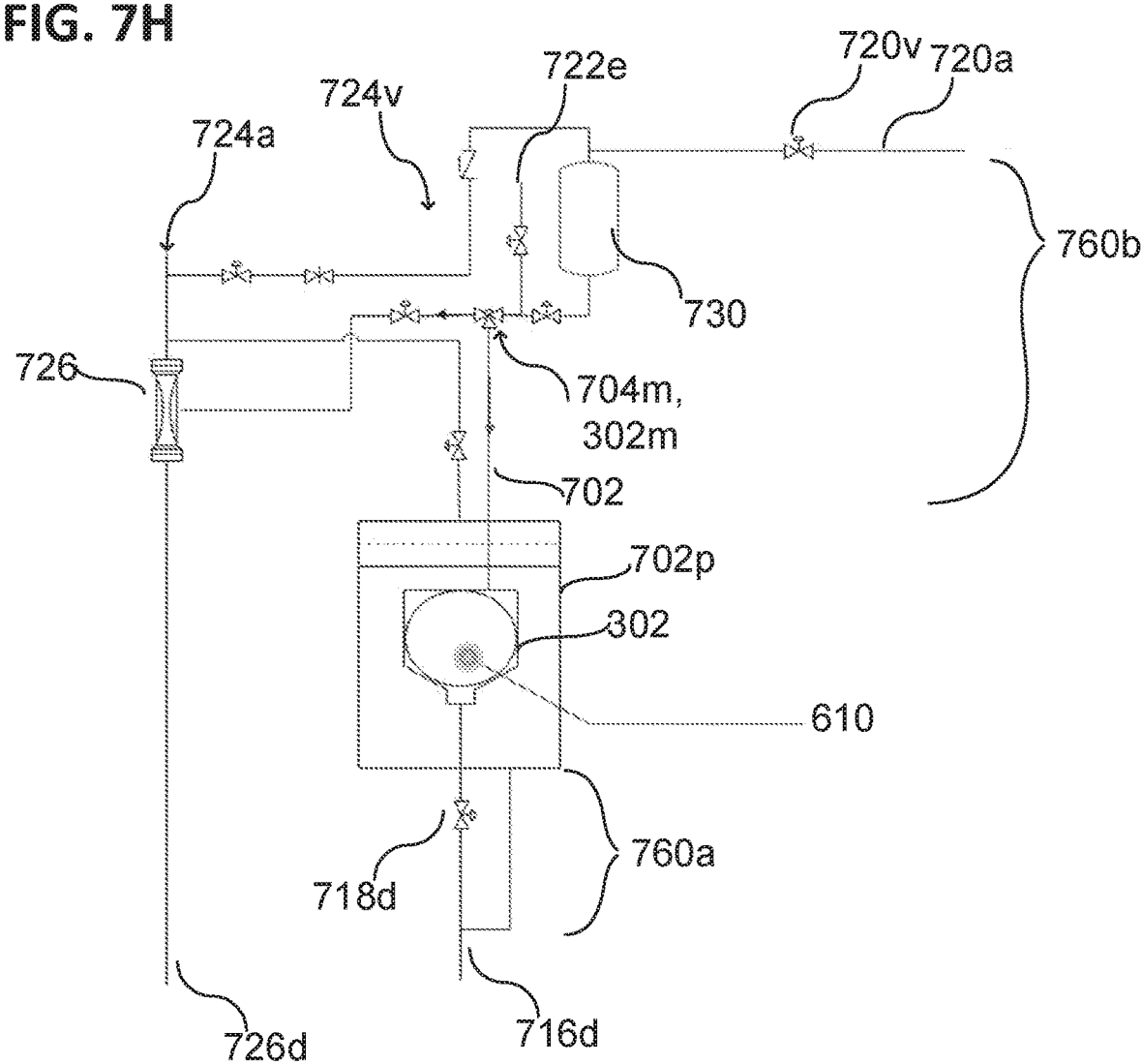
FIG. 7H shows a schematic pipe and valve layout of the processing device according to various embodiments.

FIG. 7H shows a schematic pipe and valve layout 700 of the processing device 300 described with reference to FIGS. 7A to 7G according to various embodiments. According to various embodiments, the tank 302 providing the processing region 104p for accommodating at least one wafer 610 may be arranged within an additional process chamber 702p.

According to various embodiments, the control arrangement 760a (or the first flow control structure or the first liquid control arrangement) coupled to the process chamber 702 (e.g. to the bottom of the process chamber 702) and to the tank 302 (e.g. to the bottom of the tank 302) may include a first drain 716d, e.g. for draining the liquids 204, 206 from the process chamber 702 and/or the tank 302, e.g. to drain the first liquid from the tank 302 to lower the interface 204s between the two liquids 204, 206 in the tank 302. The first drain 716d may be controlled by a first drain valve 718d.

According to various embodiments, the control arrangement 760a coupled to the tank 302 (e.g. to the bottom of the tank 302) may further include a first inlet for providing the first liquid 204 to the tank 302, e.g. to fill the tank 302 with the first liquid 204 (not illustrated). The first inlet may be controlled by a first inlet valve. Further, according to various embodiments, the first drain 716d may be coupled to a pump for pumping liquids out of the tank 302.

According to various embodiments, the control arrangement 760b (or the second flow control structure or the second liquid control arrangement) coupled to the inlet structure 302m or the manifold 704m may include an exhaust 722e controlled by an exhaust valve. Further, the control arrangement 760b coupled to the inlet structure 302m or the manifold 704m may include a reservoir 730 for the second liquid 206 and a second inlet 720a for providing (filling) the second liquid 206 in the reservoir 730. Further, the control arrangement 760b may include an aspirator 726 coupled to the inlet structure 302m or the manifold 704m, as already described with reference to FIGS. 7A to 7G. According to various embodiments, a gas inlet 724 may be included in the control arrangement 760b for introducing nitrogen into the reservoir 730, into the aspirator 726 and/or into the processing chamber 702p, as already described with reference to FIGS. 7A to 7G, wherein the gas flow may be controlled by a valve arrangement 724v. According to various embodiments, the valve arrangement 724v may be configured to pressurize the reservoir 730, to purge the processing chamber 702p, the tank 302 and/or the inlet structure 302m (or the manifold 704m), or to compensate a pressure while draining the liquids 204, 206. According to various embodiments, the aspirator 726 may be coupled to a second drain 726d.

According to various embodiments, a method (e.g. for providing a layer of an organic liquid on water) may include: filling a chamber and a tube coupled to the chamber with water, the tube extending upwards from the chamber; introducing a portion of an organic liquid into the water in the tube; at least partially removing the water from the chamber to empty the tube into the chamber so that a continuous surface layer from the introduced organic liquid is provided on the water in the chamber.

Further, according to various embodiments, the organic liquid may include or may be an alcohol.

Further, according to various embodiments, the organic liquid may include or may be at least one liquid of the following group of liquids, the group including: methanol; ethanol; propanol; isopropanol; butanol; cyclohexanol.

Further, according to various embodiments, the portion of the organic liquid may be introduced into the water in the tube such that the introduced organic liquid may be substantially separated from the water.

Further, according to various embodiments, the portion of the organic liquid may be introduced into the water in the tube such that the introduced organic liquid may substantially cover the surface of the water in the tube.

According to various embodiments, the method may further include: introducing nitrogen into the tube while at least partially removing the water from the chamber to avoid a vacuum in the tube.

Further, according to various embodiments, at least partially removing the water from the chamber may include continuously draining the water thereby continuously lowering the level of the water in the tube and subsequently continuously lowering the level of the water in the chamber.

According to various embodiments, the method may further include: providing at least one wafer in the chamber before filling the chamber and the tube with water.

Further, according to various embodiments, at least partially removing the water from the chamber may include lowering the level of the water in the chamber to expose the at least one wafer.

According to various embodiments, a processing device for processing at least one carrier may include: a chamber configured to provide a processing region for accommodating the at least one carrier and a merging region over the processing region, wherein the merging region may be tapered to a smaller horizontal extension than the horizontal extension of the processing region; a control arrangement coupled to the chamber, wherein the control arrangement is configured: to fill the processing region and the merging region with water, to introduce an organic liquid into the merging region in liquid form, and to lower a level of the water from the merging region to the processing region to form a continuous surface layer on the water from the organic liquid introduced into the merging region.

According to various embodiments, the processing device may further include a support structure to hold the at least one carrier in the processing region of the chamber.

According to various embodiments, the at least one carrier may include a wafer batch.

According to various embodiments, the merging region may be provided by a tubular structure (an inlet structure or a manifold) coupled to the chamber.

According to various embodiments, the control arrangement may include a first flow control structure (a first flow controller) and a second flow control structure (a second flow controller), wherein the first flow control structure may be configured to raise the water level in the chamber to the merging region, wherein the second flow control structure may be configured to introduce a portion of the organic liquid directly into the water in the merging region; and wherein the first flow control structure is further configured to at least partially drain the water from the chamber to lower the water level.

According to various embodiments, the control arrangement may be further configured to lower the level of the water in the processing region to expose the at least one carrier accommodated in the processing region of the chamber.

According to various embodiments, the control arrangement may further include a gas flow control structure (a gas flow controller) configured to introduce gas into the chamber while the level of the water is lowered.

According to various embodiments, the horizontal extension of the processing region of the chamber may decrease monotonically to the horizontal extension of the merging region.

According to various embodiments, a processing device may include: a chamber to accommodate at least one carrier in a processing region of the chamber; an upwardly extending inlet structure (or manifold) coupled to the chamber, the inlet structure providing a merging region connected to the processing region; a first liquid control arrangement coupled at least to the chamber, the first liquid control arrangement configured to provide a first liquid in the processing region of the chamber and to raise a level of the first liquid into the inlet structure; a second liquid control arrangement coupled to the inlet structure, the second liquid control arrangement configured to introduce a second liquid into the merging region in liquid form; wherein the first liquid control arrangement is further configured to drain the first liquid from the chamber to form a continuous surface layer on the first liquid from the second liquid introduced into the merging region and to expose the at least one carrier.

According to various embodiments, a horizontal width of the merging region may be smaller than the horizontal width of the processing region.

According to various embodiments, the processing device may further include: a gas control arrangement coupled to the inlet structure, the gas control arrangement configured to introduce gas into the inlet structure while the level of the first liquid is reduced to compensate an amount of the first liquid drained from the chamber.

According to various embodiments, the ratio of the inner diameter of the chamber to the inner diameter of the inlet structure may be in the range from about 2 to about 50, e.g. in the range from about 3 to about 40.

According to various embodiments, a method (e.g. for providing a layer of a second liquid over a first liquid) may include filling a chamber and a tube coupled to the chamber with a first liquid, the tube extending upwards from the chamber; introducing a portion of a second liquid into the first liquid in the tube; and at least partially removing the first liquid from the chamber to empty the tube into the chamber so that a continuous surface layer from the introduced second liquid is provided on the first liquid in the chamber.

Further, according to various embodiments, the second liquid may be configured to reduce the surface tension of the first liquid.

Further, according to various embodiments, the first liquid may include water or an aqueous solution and the second liquid may include an organic liquid.

Further, according to various embodiments, the second liquid may include at least one liquid of the following group of liquids, the group consisting of: methanol; ethanol; propanol; isopropanol; butanol; cyclohexanol.

Further, according to various embodiments, the portion of the second liquid may be introduced into the first liquid in the tube such that the introduced second liquid is substantially covering the surface of the first liquid in the tube.

According to various embodiments, the method may further include introducing nitrogen into the tube while at least partially removing the first liquid from the chamber to avoid a vacuum in the tube.

Further, according to various embodiments, at least partially removing the first liquid from the chamber may include continuously draining the first liquid, thereby continuously lowering the level of the first liquid in the tube and subsequently continuously lowering the level of the first liquid in the chamber.

According to various embodiments, the method may further include providing at least one wafer in the chamber before filling the chamber and the tube with the first liquid.

Further, according to various embodiments, at least partially removing the first liquid from the chamber may include lowering the level of the first liquid in the chamber to expose the at least one wafer.

According to various embodiments, a processing device for processing at least one carrier may include: a chamber configured to provide a processing region for accommodating the at least one carrier and a merging region over the processing region, wherein the merging region is tapered to a smaller horizontal extension than the horizontal extension of the processing region; a control arrangement coupled to the chamber, the control arrangement configured: to fill the processing region and the merging region with a first liquid, to introduce a second liquid into the merging region in liquid form, and to lower a level of the first liquid from the merging region to the processing region to form a continuous surface layer on the first liquid from the second liquid introduced into the merging region.

Further, according to various embodiments, the control arrangement may include a first flow control structure and a second flow control structure, wherein the first flow control structure is configured to raise the level of the first liquid in the chamber to the merging region, wherein the second flow control structure is configured to introduce a portion of the second liquid directly into the first liquid in the merging region; and wherein the first flow control structure is further configured to at least partially drain the first liquid from the chamber to lower the level of the first liquid in the chamber.

Further, according to various embodiments, the control arrangement may be further configured to lower the level of the first liquid in the processing region to expose the at least one carrier accommodated in the processing region of the chamber.

Further, according to various embodiments, the control arrangement may further include a gas flow control structure configured to introduce gas into the chamber while the level of the first liquid is lowered.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A processing device for processing at least one carrier, the processing device comprising:
a chamber configured to provide a processing region for accommodating the at least one carrier and a merging region over the processing region, wherein the horizontal extension of the merging region is smaller than the horizontal extension of the processing region, wherein the horizontal extension of the processing region tapers towards the horizontal extension of the merging region; and
a control arrangement coupled to the chamber, the control arrangement configured:
to fill the processing region and the merging region with a first liquid,
to introduce a second liquid into the merging region in liquid form, and
to lower a level of the first liquid from the merging region to the processing region to form a continuous surface layer on the first liquid from the second liquid introduced into the merging region.

2. The processing device of claim 1,
wherein the merging region of the chamber comprises an inlet structure provided by a tubular structure.

3. The processing device of claim 1,
wherein the control arrangement comprises a controller, a first flow control structure in fluid communication with the chamber and a second flow control structure in fluid communication with the chamber,
wherein the first flow control structure is configured to provide the first liquid into at least the processing region of the chamber to raise the surface level of the first liquid in the chamber to the merging region of the chamber,
wherein the second flow control structure is configured to provide a portion of the second liquid into and/or over the first liquid in the merging region,
wherein the first flow control structure is further configured to at least partially drain the first liquid from the chamber to lower the surface level of the first liquid in the chamber to the processing region of the chamber, and
wherein the controller is configured to
control the first flow control structure to provide the first liquid into at least the processing region of the chamber to raise the surface level of the first liquid in the chamber into the merging region of the chamber,
control the second flow control structure to provide a portion of the second liquid into and/or over the first liquid in the merging region when the surface level of the first liquid is in the merging region of the chamber, and
control the first flow control structure to at least partially drain the first liquid from the chamber to lower the surface level of the first liquid in the chamber into the processing region of the chamber.

4. The processing device of claim 2,
wherein the tubular structure comprises a manifold configured for inserting one or more fluids and/or at least one gas.

5. The processing device of claim 2, wherein the control arrangement comprises a first flow control structure comprising a pump and/or valve in fluid communication with the processing region of the chamber, wherein the first flow control structure is configured to pump and/or release the first liquid into the chamber to raise the level of the first liquid in the chamber into the merging region,
wherein the first flow control structure further comprises a drain valve in fluid communication with the processing region of the chamber, wherein the drain flow control structure is further configured to at least partially drain the first liquid from the chamber to lower the level of the first liquid from the merging region into the processing region of the chamber,
wherein the second flow control structure comprises a second fluid valve in fluid communication with the merging region of the tubular structure, wherein the second flow control structure is configured to provide a portion of the second liquid into and/or over the first liquid in the merging region,
further comprising:
a gas control arrangement coupled to the tubular structure, the gas control arrangement configured to provide a gas into the chamber through the tubular structure while the level of the first liquid is reduced, wherein an amount of the gas provided compensates for an amount of the first liquid drained from the chamber.

6. The processing device of claim 2, wherein the control arrangement comprises:
a first flow control structure in fluid communication with the chamber, wherein the first flow control structure is configured to provide the first liquid into the processing region and the merging region and remove the first liquid from the processing region;

a second flow control structure in fluid communication with the inlet structure, wherein the second flow control structure is configured to provide the second liquid into the merging region; and a controller coupled to the first flow control structure and the second flow control structure, the controller configured:

to control the first flow control structure to fill the processing region and the merging region with the first liquid, to control the second flow control structure to introduce a second liquid into the merging region in liquid form when a surface level of the first liquid is in the merging region, and to control the first flow control structure to lower the surface level of the first liquid from the merging region to the processing region to form a continuous surface layer of the second liquid on the first liquid from the second liquid introduced into the merging region.

7. The processing device of claim 6, wherein the at least one carrier is a plurality of semiconductor wafers, wherein the processing region of the chamber is configured to accommodate each of the at least one carrier orientated in a vertical position so that each of the at least one carrier is completely immersed in the first liquid when at least the processing region is filled with the first liquid, and further comprising:

a support structure to hold the at least one carrier in the processing region of the chamber in the vertical position.

8. The processing device of claim 6, wherein the first flow control structure comprises a drain flow control structure in fluid communication with the chamber, wherein the drain flow control structure is configured to remove the first liquid and/or the second liquid from the chamber, wherein the controller is further configured to control the drain flow control structure to remove the first liquid at a first draining speed when a first portion of the second liquid is provided so as to lower the level of the first liquid in the merging region and to remove the first liquid at a second draining speed when the level of the first liquid is in the processing region so as to lower the level of the first liquid to expose the at least one carrier accommodated in the processing region of the chamber.

9. The processing device of claim 6, wherein the control arrangement further comprises a gas flow control structure in fluid communication with the inlet structure, wherein the gas flow control structure is configured to provide a gas into the chamber, and wherein the processing region and merging region are gas tight, and wherein the controller is further coupled to the gas flow control structure and is configured to control the gas flow control structure to introduce the gas into the chamber while the surface level of the first liquid is lowered.

10. The processing device of claim 6, wherein the horizontal extension of the processing region of the chamber decreases monotonically to the horizontal extension of the merging region.

* * * * *